(12) United States Patent
Hanamura

(10) Patent No.: US 10,026,897 B2
(45) Date of Patent: Jul. 17, 2018

(54) METHOD FOR MANUFACTURING ORGANIC EL APPARATUS, ORGANIC EL APPARATUS, AND ELECTRONIC DEVICE

(71) Applicant: SEIKO EPSON CORPORATION, Tokyo (JP)

(72) Inventor: Yuki Hanamura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/661,934

(22) Filed: Mar. 18, 2015

(65) Prior Publication Data
US 2015/0287959 A1 Oct. 8, 2015

(30) Foreign Application Priority Data

Apr. 8, 2014 (JP) .................... 2014-079186
Jan. 7, 2015 (JP) .................... 2015-001353

(51) Int. Cl.
*H01L 51/00* (2006.01)
*H01L 51/52* (2006.01)
(Continued)

(52) U.S. Cl.
CPC ...... *H01L 51/0018* (2013.01); *H01L 21/0214* (2013.01); *H01L 21/0217* (2013.01);
(Continued)

(58) Field of Classification Search
CPC . H01L 51/0096; H01L 51/52; H01L 51/5203; H01L 51/5237; H01L 51/5253;
(Continued)

(56) References Cited

U.S. PATENT DOCUMENTS

2002/0121860 A1* 9/2002 Seo .................. H01L 51/5012
313/506
2004/0061434 A1 4/2004 Mori et al.
(Continued)

FOREIGN PATENT DOCUMENTS

JP 2001-006049 A 1/2001
JP 2004-063126 A 2/2004
(Continued)

OTHER PUBLICATIONS

Kastenmeier, B. E. E., Matsuo, P. J., and Oehrlein, G. S. Highly selective etching of silicon nitride over silicon and silicon dioxide. J. Vac. Sci. Technol. A, 17, 6, (1999) 3179-3184.*
(Continued)

*Primary Examiner* — Robert Huber
*Assistant Examiner* — Gardner W Swan
(74) *Attorney, Agent, or Firm* — Oliff PLC

(57) ABSTRACT

A method for manufacturing an organic EL apparatus includes forming an organic EL element and a mounting terminal on a substrate of an element substrate as a first substrate, forming sealing films so as to cover at least the organic EL element and the mounting terminal, adhering a sealing substrate as a second substrate with respect to the element substrate using a filler, and etching the sealing films so as to expose at least a part of the mounting terminal, in which, in the etching of the sealing films, the second substrate, which is formed with a composition which reacts with an etching gas and vaporizes, or a protective member, which covers at least a part of the second substrate, is used as a mask.

12 Claims, 11 Drawing Sheets

(51) Int. Cl.
*H01L 21/02* (2006.01)
*H01L 27/32* (2006.01)

(52) U.S. Cl.
CPC .. *H01L 21/02164* (2013.01); *H01L 21/02178* (2013.01); *H01L 21/02337* (2013.01); *H01L 27/322* (2013.01); *H01L 51/0024* (2013.01); *H01L 51/0096* (2013.01); *H01L 51/5246* (2013.01); *H01L 51/5253* (2013.01); *H01L 2251/558* (2013.01)

(58) Field of Classification Search
CPC . H01L 51/56; H01L 21/0217; H01L 21/0214; H01L 21/02337; H01L 21/02178
See application file for complete search history.

(56) References Cited

U.S. PATENT DOCUMENTS

| | | | |
|---|---|---|---|
| 2004/0069987 A1 | 4/2004 | Yoneda et al. | |
| 2005/0218803 A1 | 10/2005 | Takeuchi et al. | |
| 2007/0054430 A1 | 3/2007 | Nishigaki | |
| 2009/0026172 A1* | 1/2009 | Kitabata | H01J 37/32972 216/84 |
| 2012/0291275 A1* | 11/2012 | Rha | H05K 3/107 29/846 |
| 2015/0179717 A1* | 6/2015 | Kawata | H01L 29/7869 257/43 |
| 2015/0263315 A1* | 9/2015 | Uetake | H01L 51/5234 257/40 |
| 2016/0064695 A1* | 3/2016 | Yoshihara | H01L 51/524 257/40 |
| 2016/0072099 A1* | 3/2016 | Okamoto | H01L 51/5253 257/40 |

FOREIGN PATENT DOCUMENTS

| | | |
|---|---|---|
| JP | 2004-127637 A | 4/2004 |
| JP | 2005-285659 A | 10/2005 |
| JP | 2007-073353 A | 3/2007 |
| JP | 2007-073355 A | 3/2007 |
| JP | 2007-080569 A | 3/2007 |
| JP | 2007-234610 A | 9/2007 |

OTHER PUBLICATIONS

Woo, J. C. and Kim, C. I. Dry etch properties of IZO thin films in a CF4/Ar adaptively coupled plasma system. Vacuum, 86 (2012) 1336-1340.*

* cited by examiner

METHOD FOR MANUFACTURING ORGANIC EL APPARATUS, ORGANIC EL APPARATUS, AND ELECTRONIC DEVICE

BACKGROUND

1. Technical Field

The present invention relates to a method for manufacturing an organic EL apparatus which is provided with an organic electroluminescence (EL) element, an organic EL apparatus, and an electronic device which is provided with the organic EL apparatus.

2. Related Art

An organic electroluminescent (below, "EL") element has a configuration where a functional layer which includes an organic light emitting layer is interposed between an anode and a cathode. Holes which are injected from an anode and electrons which are injected from a cathode excite a functional layer by re-bonding and emit fluorescent or phosphorescent light according to the material of the organic light emitting layer.

On the other hand, it is also known that organic EL elements are influenced by moisture or oxygen (below, "moisture or the like") from outside. In a case where moisture or the like enters an organic EL element, for example, the state of the interface between both electrodes and the functional layer changes and it is not possible to efficiently transport the holes or electrons to the functional layer and, as a result, so-called dark spots where it is not possible to obtain a desired brightness in an organic light emitting layer may be generated. That is, in the organic EL element, a sealing technique for excluding the influence of moisture or the like is extremely important and several countermeasures therefor have been employed up to now.

For example, a "thin film sealing method" in which the organic EL element is covered with a sealing film with high gas barrier properties with respect to moisture or the like has been proposed. In the thin film sealing method, the gas barrier properties are secured with respect to the moisture or the like by forming a sealing film in a region where an organic EL element is formed. Then, normally, since a mounting electrode for creating conduction between the organic EL element and outside is also already formed in a phase before the sealing film is formed, there are cases where the sealing film also overlaps the mounting terminal. Therefore, a method in which a mounting terminal is masked with a metal mask or the like in advance is adopted.

In a case of using a metal mask, variations are generated in the film thickness of the sealing film, caused by limits on the incidence of forming particles of the sealing film in the periphery of an opening section of the metal mask, the sealing film wrapping around directly under an end section of the opening section of the metal mask, or the like. Thus, in order to reliably cover the organic EL element with the sealing film, it is necessary to widely secure an interval between the opening section of the metal mask and the organic EL element to a certain extent, which is also a factor inhibiting the miniaturization of the organic EL apparatus.

As a method which solves such a problem, JP-A-2007-234610 discloses a method in which, after forming a protective film in an organic EL element, a protective film which overlaps an external connecting region which includes an external connecting terminal is anisotropically etched while using a sealing substrate of a display apparatus, which is provided with the organic EL element, as a mask. According to this method, it is possible to expose the external connecting region by selectively removing a protective film along a vertical surface which includes an end surface of the sealing substrate.

However, according to JP-A-2007-234610 described above, since a sealing substrate is used as a mask, the sealing substrate is also etched to no small extent. For example, in a case of using blue sheet glass, non-alkali glass, or the like for the sealing substrate, a component (for example, Al, Ca, or the like or oxides thereof) other than silicon oxide (SiO) which is included in the glass remains without being removed as a reaction product during etching. Then, there is a concern that these residues will be re-attached to the external connecting terminal after removing the protective film. Thus, in a process which is performed later and in which electrical connection between the external connecting terminal and an external circuit is obtained, the connection reliability deteriorates due to the connection strength being reduced and problems also occur in which the electrical characteristics cannot be secured.

SUMMARY

Aspects of the invention have been made in order to solve at least a part of the problems described above and are able to be realized as the following embodiments or application examples.

Application Example 1

According to this application example, there is provided a method for manufacturing an organic EL apparatus including forming an organic EL element and a mounting terminal on a first substrate, forming a sealing film so as to cover at least the organic EL element and the mounting terminal, adhering a second substrate with respect to the first substrate using a filler, and etching the sealing film so as to expose at least a part of the mounting terminal, in which, in the etching of the sealing film, the second substrate, which is formed with a composition which reacts with an etching gas and vaporizes, or a protective member, which covers at least a part of the second substrate, is used as a mask.

According to the application example, an organic EL element and a mounting terminal are formed on a first substrate and a sealing film is further formed so as to cover the organic EL element and the mounting terminal. The second substrate or the second substrate of which at least a portion is covered by the protective member is further adhered via a filler on an upper section of a sealing film. Thus, it is possible to remove a portion, which overlaps the mounting terminal, in the sealing film by etching the second substrate or the protective member as a mask. In addition, in a case where the second substrate is configured of a composition which reacts with an etching gas etching the sealing film and vaporizes, since a reaction product does not remain even when the second substrate is etched in the etching of the sealing film, the residue does not influence the mounting terminal. In addition, in a case of using the protective member of the second substrate as the mask, since the second substrate is not easily etched in the etching of the sealing film and a reaction product does not easily remain during etching regardless of the material configuration of the second substrate, the residue does not influence the mounting terminal in the same manner. In other words, it is possible to provide a method for manufacturing an organic EL apparatus which is able to secure high connection reliability with an external circuit.

Application Example 2

In the method for manufacturing an organic EL apparatus according to the application example described above, it is preferable that the sealing film have a silicon oxynitride film as a main component and the second substrate is quartz glass.

According to the application example, the main component of the sealing film is a silicon oxynitride film and the second substrate is quartz glass. Thus, in the etching of the sealing film, since a component of the quartz glass of the second substrate reacts with an etching gas of the silicon oxynitride film and vaporizes, the mounting terminal is not influenced. Thus, it is possible to manufacture an organic EL apparatus with high connection reliability.

Application Example 3

In the method for manufacturing an organic EL apparatus according to the application example described above, it is preferable that the protective member be a photosensitive resin.

According to the application example, it is possible to etch a portion which overlaps the mounting terminal in the sealing film using a photosensitive resin which is the protective member as a mask. In addition, even when the photosensitive resin is attached to the mounting terminal, it is possible to easily remove the photosensitive resin. Thus, the degree of freedom in the design is widened and it is possible to facilitate a manufacturing process regardless of the material of a second substrate.

Application Example 4

In the method for manufacturing an organic EL apparatus according to the application example described above, it is preferable that the sealing film and the protective member have the same material as the main component.

According to the application example, in the etching of the sealing film, since the protective member is also vaporized in the same manner as the sealing film and a reaction product of the protective member does not remain, the residue does not influence the mounting terminal.

Application Example 5

In the method for manufacturing an organic EL apparatus according to the application example described above, it is preferable that the protective member include any of a silicon oxide film, a silicon nitride film, a silicon oxynitride film, or an aluminum oxide film.

According to the application example, the protective member includes any one of a silicon oxide film, a silicon nitride film, a silicon oxynitride film, or an aluminum oxide film. Since these members are vaporized as reaction products or are not etched when etching the sealing film which covers the mounting terminal, there is no influence on the mounting terminal. In addition, all of the members are transparent with respect to light in the visible light region. Thus, it is possible to extract emitted light from the organic EL element without removing the protective member from the second substrate. Thus, it is possible to reduce the number of processes and manufacture an organic EL apparatus with high connection reliability.

Application Example 6

In the method for manufacturing an organic EL apparatus according to the application example described above, it is preferable that an etching rate of the sealing film be greater than an etching rate of the protective member.

According to the application example, for example, even in a case of forming a sealing film and a protective member with substantially the same film thickness, the protective member remains at the time of removing the sealing film, which covers the mounting terminal, by etching. Thus, it is possible to protect the surface of the second substrate covered by the protective member.

Application Example 7

In the method for manufacturing an organic EL apparatus according to the application example described above, it is preferable that the sealing film have a silicon nitride film as a main component and the protective member is a silicon oxide film.

According to the application example, it is possible to make the etching rate of the silicon nitride film greater than the etching rate of the silicon oxide film by appropriately selecting the etching gas. For example, a fluorine-based etching gas may be used. Therefore, for example, even in a case of forming a sealing film and a protective member with substantially the same film thickness, it is possible to maintain a state where the surface of the second substrate is protected with a protective member at the time of removing the sealing film, which covers the mounting terminal, by etching. That is, it is possible to realize a protective member which is a favorable mask when etching a sealing film.

Application Example 8

In the method for manufacturing an organic EL apparatus according to the application example described above, it is preferable that a refractive index of the second substrate and a refractive index of the protective member are close. In other words, in a case where the second substrate has silicon oxide (SiO) such as blue sheet glass or non-alkali glass as a main component and is a glass which contains a component other than SiO, the protective member is preferably a silicon oxide film.

According to the application example, by the refractive index of the second substrate and the refractive index of the protective member being close, even when the protective member is non-uniformly removed by etching, residual film thickness unevenness of the protective member is hardly visible.

Application Example 9

In the method for manufacturing an organic EL apparatus according to the application example described above, it is preferable that a thickness of the protective member be greater than a thickness of the sealing film at a portion which covers the mounting terminal.

According to the application example, the thickness of the protective member is formed to be greater than the thickness of the sealing film which is formed in a mounting terminal. Therefore, at the time of removing the sealing film, which covers the mounting terminal, by etching, the protective member still remains and it is possible to protect the surface of a second substrate with a protective member.

Application Example 10

According to this application example, there is provided an organic EL apparatus including a first substrate which is formed with an organic EL element and a mounting terminal, a sealing film which covers at least the organic EL element, and a second substrate which is adhered via a filler on a side where the organic EL element of the first substrate is formed, in which the second substrate is formed with a composition which reacts with an etching gas capable of etching the sealing film and vaporizes, or at least at a part of a surface of an opposite side with respect to a side of the second substrate which opposes the first substrate is covered by a protective member.

According to the application example, even when all or a part of the mounting terminal is covered by the sealing film, it is possible to etch the sealing film using the second substrate or the protective member of the second substrate as a mask. Accordingly, it is possible to expose the mounting terminal without being influenced by a residue which is generated during etching and to provide an organic EL apparatus with high connection reliability.

Application Example 11

In the organic EL apparatus according to the application example described above, it is preferable that the sealing film have a silicon oxynitride film as a main component and the second substrate is quartz glass.

According to the application example, it is possible to provide an organic EL apparatus not only with high connection reliability, but also with favorable light transmitting properties.

Application Example 12

In the organic EL apparatus according to the application example described above, it is preferable that the protective member be a photosensitive resin.

According to the application example, it is possible to provide an organic EL apparatus with high connection reliability regardless of the material of the second substrate.

Application Example 13

In the organic EL apparatus according to the application example described above, it is preferable that the sealing film and the protective member have the same material as the main component.

According to the application example, since it is possible to etch the protective member at the same time as etching the sealing film, it is possible to make a dedicated process for reducing the thickness of the protective member or removing a protective member unnecessary. In other words, it is possible to provide an organic EL apparatus with high productivity and high connection reliability.

Application Example 14

In the organic EL apparatus according to the application example described above, it is preferable that the protective member include any of a silicon oxide film, a silicon nitride film, a silicon oxynitride film, or an aluminum oxide film.

According to the application example, it is possible to manufacture an organic EL apparatus with high connection reliability without light emitted from the organic EL element being influenced by the protective member.

Application Example 15

In the organic EL apparatus according to the application example described above, it is preferable that the sealing film have a silicon nitride film as a main component and the protective member is a silicon oxide film.

According to the application example, since the etching rate of the sealing film is greater than the etching rate of the protective member, it is possible for the protective member to reliably remain even when the sealing film is etched. In addition, even when the protective member remains as it is, the protective member does not have an influence with respect to the light emitted from an organic EL element. Thus, it is possible to provide an organic EL apparatus with excellent light emitting characteristics and high connection reliability.

Application Example 16

In the organic EL apparatus according to the application example described above, it is preferable that a refractive index of the second substrate and a refractive index of the protective member are close. In other words, in a case where the second substrate is blue sheet glass or non-alkali glass, the protective member is preferably a silicon oxide film.

According to the application example, by the refractive index of the second substrate and the refractive index of the protective member being close, even when the protective member is non-uniformly removed by etching, residual film thickness unevenness of the protective member is hardly visible.

Application Example 17

In the organic EL apparatus according to the application example described above, a thickness of the protective member may be greater than a thickness of a portion of the sealing film which protrudes from the second substrate.

According to the application example, even when using the protective member as a mask, since it is possible to reliably protect a surface of a second substrate with the protective member, it is possible to provide an organic EL apparatus with high connection reliability.

Application Example 18

According to this application example, there is provided an electronic device including the organic EL apparatus formed using the method for manufacturing the organic EL apparatus.

According to the application example, it is possible to provide an electronic device which is provided with an organic EL apparatus with high connection reliability.

Application Example 19

According to this application example, there is provided an electronic device including the organic EL apparatus.

According to the application example, it is possible to provide an electronic device which is provided with an organic EL apparatus with high connection reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, description will be given of embodiments which embody the invention with reference to the diagrams. Here, the diagrams to be used are presented after being appropriately enlarged or reduced such that it is possible to clearly recognize portions to be described and promote understanding of a reader.

In addition, in the following description of the embodiments, for example, a case where "on a substrate" is described includes a case of being arranged so as to come into contact with a substrate, a case of being arranged on a substrate via another component, or a case where a part is arranged so as to come into contact with a substrate and a part is arranged via another component.

First Embodiment

Organic EL Apparatus

Figure 1:
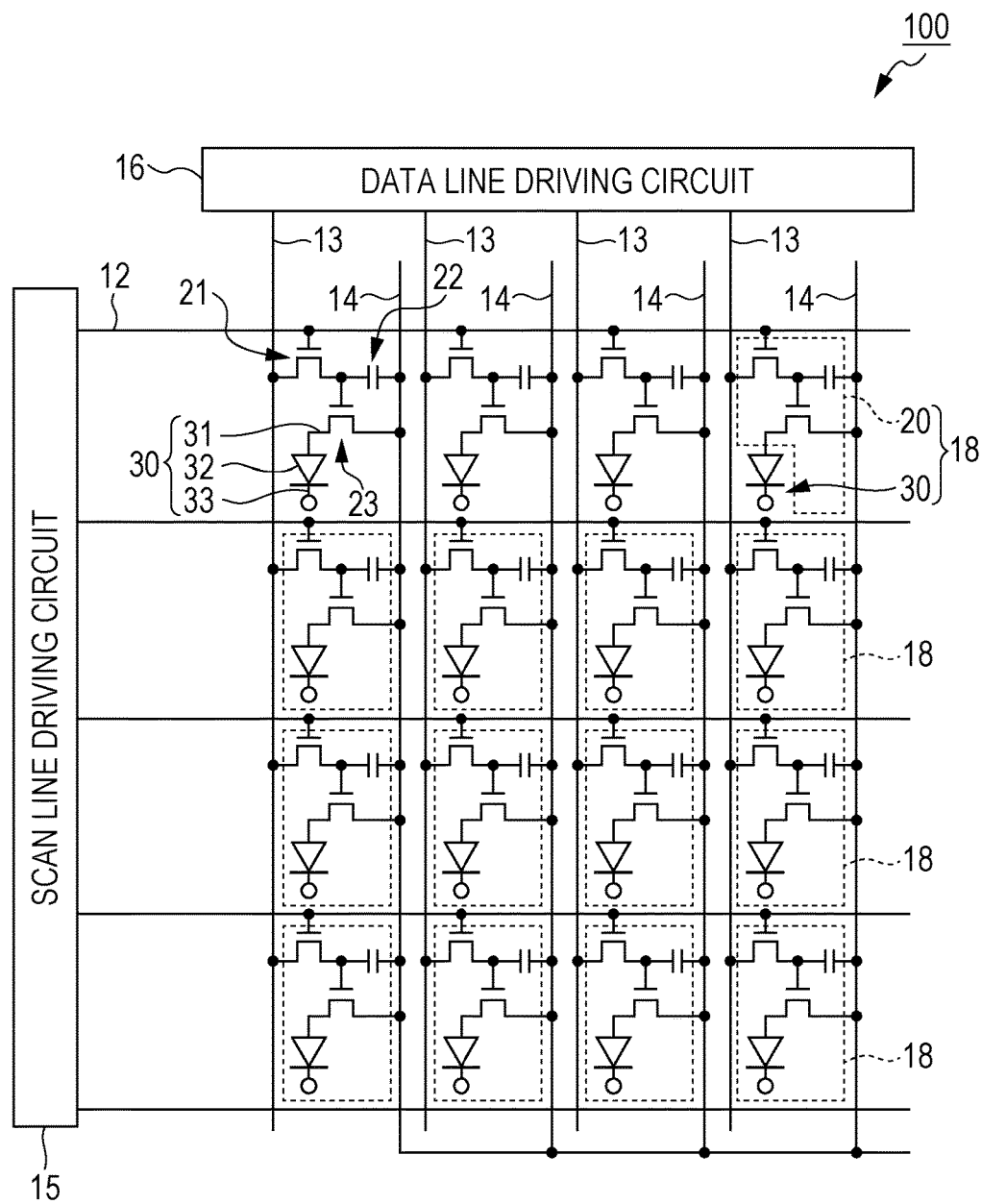
FIG. 1 is an equivalent circuit diagram which shows an electrical configuration of an organic EL apparatus according to a first embodiment.
Figure 2:
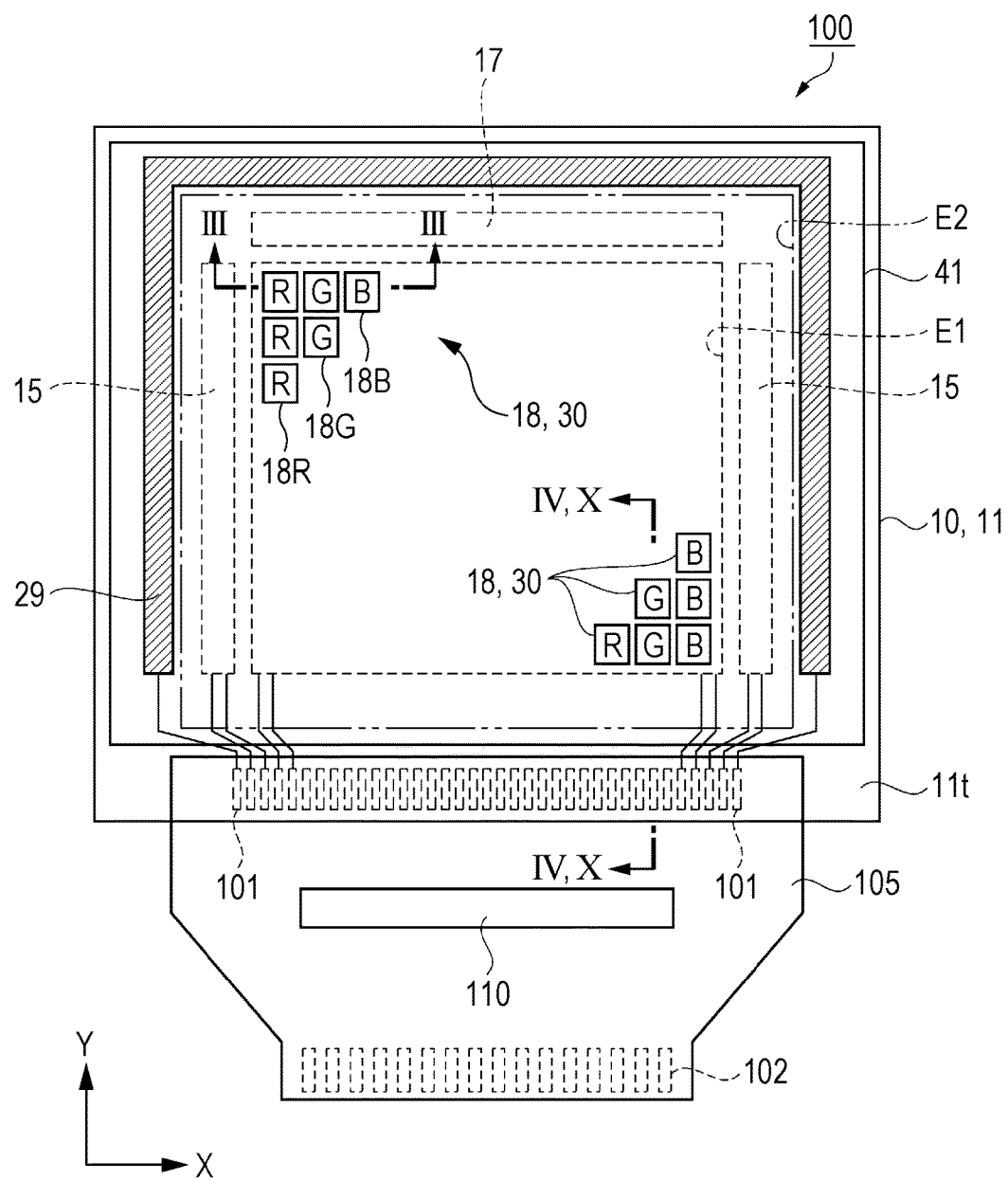
FIG. 2 is a schematic planar diagram which shows a configuration of an organic EL apparatus according to the first embodiment.

Description will be given of an organic EL apparatus in the present embodiment using FIG. 1 to FIG. 3. FIG. 1 is an equivalent circuit diagram which shows an electrical configuration of an organic EL apparatus according to the first embodiment. FIG. 2 is a schematic planar diagram which shows a configuration of an organic EL apparatus according to the first embodiment.

As shown in FIG. 1, an organic EL apparatus 100 according to the present embodiment has a plurality of scan lines 12, a plurality of data lines 13, and power lines 14 which intersect with each other. The plurality of the scan lines 12 are connected with a scan line driving circuit 15 and the plurality of the data lines 13 are connected with a data line driving circuit 16. A plurality of sub pixels 18 are arranged in a matrix form corresponding to each intersecting section between the plurality of the scan lines 12 and the plurality of the data lines 13.

The sub pixels 18 include an organic EL element 30 which is a light emitting element and a pixel circuit 20 for controlling driving of the organic EL element 30.

The organic EL element 30 is configured of a pixel electrode 31 which functions as an anode, a counter electrode 33 which functions as a cathode, a functional layer 32 which includes an organic light emitting layer which is a light emitting body which is provided between the pixel electrode 31 and the counter electrode 33. It is possible to describe the organic EL element 30 as an electrical diode.

The pixel circuit 20 has a switching transistor 21, a storage capacitor 22, and a driving transistor 23. It is possible to configure the switching transistor 21 and the driving transistor 23, for example, using an n-channel type or p-channel type thin film transistor (TFT) or a MOS transistor.

A gate of the switching transistor 21 is connected with the scan line 12, either of a source or a drain is connected with the data line 13, and the other of the source or the drain is connected with a gate of the driving transistor 23. Either of a source or a drain of the driving transistor 23 is connected with the pixel electrode 31 of the organic EL element 30 and the other of the source or the drain is connected with the power line 14. The storage capacitor 22 is connected between the gate of the driving transistor 23 and the power line 14.

When a control signal is supplied from the scan line driving circuit 15 to the switching transistor 21 via the scan line 12, a gate is set to an on state. Then, a potential based on an image signal which is supplied from the data line driving circuit 16 via the data line 13 is held in the storage capacitor 22 via the switching transistor 21. The on or off state of a gate of the driving transistor 23 is determined corresponding to the potential which is held in the storage capacitor 22, that is, the gate potential of the driving transistor 23. When the gate of the driving transistor 23 is in the on state, a current flows in the functional layer 32, which is interposed between the pixel electrode 31 and the counter electrode 33, from the power line 14 via the driving transistor 23. The organic EL element 30 emits light according to the size of the current which flows in the functional layer 32.

Here, the configuration of the pixel circuit 20 is not limited thereto. For example, the pixel circuit 20 may be provided between the pixel electrode 31 and the driving transistor 23 and may be provided with a transistor for controlling light emission which controls conduction between the pixel electrode 31 and the driving transistor 23.

FIG. 2 is a schematic planar diagram of the organic EL apparatus 100 according to the first embodiment. Here, in FIG. 2, in order to facilitate understanding of the invention, in the drawings, there are cases where a dashed line is used when a solid line is to be used or a solid line is used when a dashed line is to be used.

The organic EL apparatus 100 has an element substrate 10 and a sealing substrate 41 which is arranged to oppose the element substrate 10. A display region E1 (shown with a dashed line in the diagram) and a dummy region E2 (shown with a two-dot chain line in the diagram) outside the display region E1 are provided in the element substrate 10. Parts outside the dummy region E2 are a non-display region.

The sub pixels 18 are arranged in a matrix form in the display region E1. As described above, the sub pixel 18 is provided with the organic EL element 30 which is a light emitting element and emitted light of any color of red (R), green (G), and blue (B) is obtained along with the operation of the switching transistor 21 and the driving transistor 23. Here, a pixel which emits red light is a sub pixel 18R, a pixel which emits green light is a sub pixel 18G, and a pixel which emits blue light is a sub pixel 18B. Below, there are also cases where "the sub pixels 18" is used to represent all of the sub pixels 18R, 18G, and 18B.

In the present embodiment, the sub pixels 18 where emitted light of the same color is obtained are arranged in the vertical direction in the diagram and the sub pixels 18 where emitted light of different colors is obtained are arranged in the horizontal direction. This arrangement of the sub pixels 18 is referred to as a stripe system. Below, description will be given by setting a direction in which the sub pixels 18 where emitted light of different colors is obtained are arrayed as an X direction and setting a direction in which the sub pixels 18 where emitted light of the same color is obtained are arrayed as a Y direction.

Arrays of the sub pixels 18 in the X direction are set as R, G, and B in the diagram; however, without being limited thereto, it is possible to use a plurality of combinations. In addition, the arrays of the sub pixels 18 are not limited to the stripe system and may be a mosaic system or a delta system.

The arrangement pitches of the sub pixels 18R, 18G, and 18B in the X direction are, for example, less than 5 μm. The sub pixels 18R, 18G, and 18B are arranged by being spaced at intervals of, for example, 0.5 μm to 1.0 μm in the X direction. The arrangement pitches of the sub pixels 18R, 18G, and 18B in the Y direction are, for example, less than 10 μm.

A peripheral circuit for causing the organic EL element 30 of each of the sub pixels 18 to emit light is provided mainly in the dummy region E2. For example, as shown in FIG. 2, a pair of the scan line driving circuits 15 are provided extending in the Y direction to a position which interposes the display region E1 in the X direction. An inspection circuit 17 is provided in a position along the display region E1 between a pair of the scan line driving circuits 15.

The element substrate 10 has a wiring layer 29 which is arranged to surround the dummy region E2 extending in the Y direction along a pair of the scan line driving circuits 15 and in the X direction along the inspection circuit 17. The counter electrode 33 of the organic EL element 30 is formed as a common cathode over a plurality of the organic EL elements 30, that is, a plurality of the sub pixels 18. In addition, the counter electrode 33 is formed to cover from the display region E1 to a non-display region and is electrically connected with the wiring layer 29 described above in the non-display region.

The element substrate 10 is larger than the sealing substrate 41 and a plurality of mounting terminals 101 for electrically connecting with an external driving circuit are arrayed in the X direction in one side section which protrudes from the sealing substrate 41 in the Y direction (in the diagram, a side section between an end section on the lower part of the element substrate 10 and the dummy region E2; referred to below as a terminal section 11t). A flexible circuit substrate (below, FPC) 105 is connected with the plurality of the mounting terminals 101. A driving IC 110 is mounted in the FPC 105. The driving IC 110 includes the data line driving circuit 16 described above. The FPC 105 has an input terminal 102 which is connected with the input side of the driving IC 110 via wiring and an output terminal (which is not shown in the diagram) which is connected with the output side of the driving IC 110 via wiring. The data line 13 or the power line 14 on the element substrate 10 side is electrically connected with the driving IC 110 via the mounting terminals 101 and the FPC 105. The wiring which is connected with the scan line driving circuit 15 or the inspection circuit 17 is electrically connected with the driving IC 110 via the mounting terminals 101 and the FPC 105. The counter electrode 33 as a common cathode is also electrically connected with the driving IC 110 via the wiring layer 29, the mounting terminals 101, and the FPC 105. Accordingly, a control signal, a potential for driving (VDD), or the like from the driving IC 110 is supplied to any of the plurality of the mounting terminals 101 which are arrayed in the terminal section 11t. That is, securing electrical connection reliability between the mounting terminals 101 and an output terminal on the FPC 105 side greatly contributes to the operation of the organic EL apparatus 100.

It is possible to use a method which is known in the art as a method for electrically connecting the plurality of the mounting terminals 101 on the element substrate 10 side and an output terminal on the FPC 105 side and examples thereof include a method in which a thermoplastic anisotropic conductive film or a thermosetting type anisotropic adhesive is used.

Next, description will be given of the structure of the organic EL apparatus 100 with reference to FIG. 3 and FIG. 4. FIG. 3 is a schematic cross-sectional diagram which shows the structure of the organic EL apparatus 100 along the line III-III in FIG. 2 and FIG. 4 is a schematic cross-sectional diagram which shows the structure of the organic EL apparatus 100 along the line IV-IV in FIG. 2. FIG. 3 shows the structure of the sub pixels 18 in the display region E1 and FIG. 4 shows the structure of the terminal section 11t. Here, a base material 11 described below is equivalent to a first substrate in the invention and the sealing substrate 41 is equivalent to the second substrate in the invention.

Figure 3:
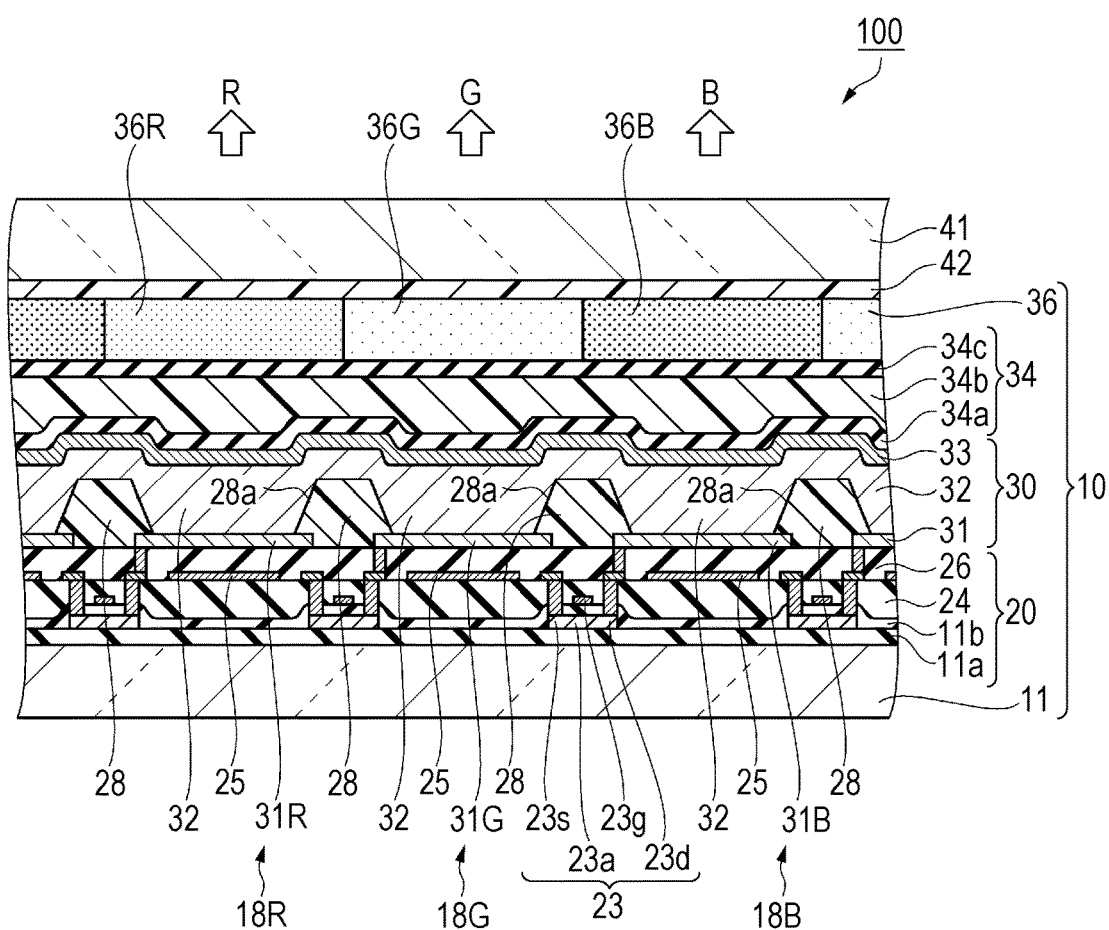
FIG. 3 is a schematic cross-sectional diagram taken along a line III-III in the organic EL apparatus shown in FIG. 2.
Figure 4:
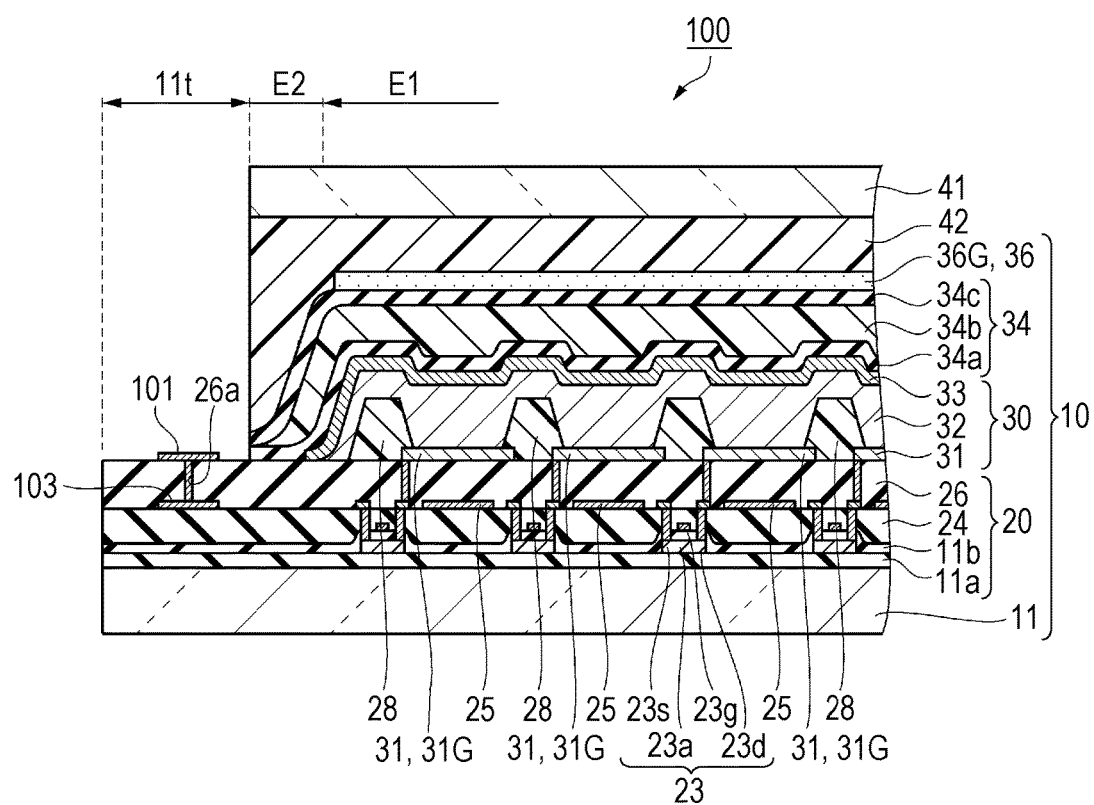
FIG. 4 is a schematic cross-sectional diagram taken along a line IV-IV in the organic EL apparatus shown in FIG. 2.

As shown in FIG. 3, the organic EL apparatus 100 is provided with the element substrate 10 which includes the base material 11, in addition to the pixel circuit 20, the organic EL element 30, a sealing layer 34, which seals a plurality of the organic EL elements 30, and a color filter 36 which are formed in sequence on the base material 11. In addition, the sealing substrate 41 which is arranged to oppose with respect to the element substrate 10 is provided.

The sealing substrate 41 is formed of a transparent substrate with respect to a visible light region, for example, such as quartz glass and is arranged to oppose the element substrate 10 via a filler 42 in order to protect the color filter 36 which is formed on the sealing layer 34 in the element substrate 10.

Light emitted from the functional layer 32 of the sub pixels 18R, 18G, and 18B is reflected by a reflecting layer 25 which will be described below and is extracted from the sealing substrate 41 side after passing through the color filter 36. That is, the organic EL apparatus 100 is a top emission type light emitting apparatus.

Since the organic EL apparatus 100 is a top emission type, it is possible to use not only a transparent substrate such as quartz glass, but also an opaque substrate such as silicon (Si) or ceramics for the base material 11. Below, description will be given of an example of a case of using quartz glass as the base material 11 and using a thin film transistor as the pixel circuit 20.

A first insulating film 11a is formed covering the surface of the base material 11. For example, a semiconductor layer 23a of the driving transistor 23 in the pixel circuit 20 is formed on the first insulating film 11a. A second insulating film 11b which functions as a gate insulating film covering the semiconductor layer 23a is formed. A gate electrode 23g is formed in a position which opposes a channel region of the semiconductor layer 23a via the second insulating film 11b. A first interlayer insulating film 24 is formed with a film thickness of 300 nm to 2 µm covering the gate electrode 23g. A planarization process is carried out on the first interlayer insulating film 24 in order to remove unevenness on a surface which is generated by covering the driving transistor 23 of the pixel circuit 20 and the like. Contact holes which pass through the second insulating film 11b and the first interlayer insulating film 24 are formed respectively corresponding to a source region 23s and a drain region 23d of the semiconductor layer 23a. A conductive film is formed so as to fill these contact holes and patterned to form an electrode or wiring which is connected with the driving transistor 23. In addition, the conductive film described above has light reflection properties and for example, is formed using aluminum (Al), an alloy of aluminum (Al) and silver (Ag) or copper (Cu), or the like. By carrying out patterning thereon, the reflecting layer 25, which is independent, is formed for each sub pixel 18. In the present embodiment, the light reflectivity of the reflecting layer 25 is preferably 40% or more and more preferably 80% or more. Although not shown in FIG. 3, the switching transistor 21 or the storage capacitor 22 in the pixel circuit 20 is also formed on the base material 11.

A second interlayer insulating film 26 is formed with a film thickness of 10 nm to 2 µm covering the reflecting layer 25 and the first interlayer insulating film 24. In addition, a contact hole for electrically connecting the pixel electrode 31 and the driving transistor 23 later is formed to pass through the second interlayer insulating film 26. It is possible to use, for example, a silicon oxide, a silicon nitride, or a silicon oxynitride as the material which configures the first insulating film 11a, the second insulating film 11b, the first interlayer insulating film 24, and the second interlayer insulating film 26.

A conductive layer is formed covering the second interlayer insulating film 26 so as to fill the contact hole which is formed in the second interlayer insulating film 26. Pixel electrodes 31 (31R, 31G, and 31B) are formed by patterning the conductive film. The pixel electrodes 31 (31R, 31G, and 31B) are formed using a transparent conductive film of indium tin oxide (ITO), indium zinc oxide (IZO), or the like. In the present embodiment, the light transmittance of the pixel electrode 31 is preferably 50% or more and more preferably 80% or more. Here, in a case where the reflecting layer 25 is not provided for each sub pixel 18, the pixel electrodes 31 (31R, 31G, and 31B) may be formed using aluminum (Al) with light reflection properties or an alloy thereof.

A partition wall 28 is formed covering outer edge sections of each of the pixel electrodes 31R, 31G, and 31B. Due to this, an opening section 28a is formed in each of the pixel electrodes 31R, 31G, and 31B. The partition wall 28 is formed to respectively divide each of the pixel electrodes 31R, 31G, and 31B at a height of approximately 1 µm using, for example, an acryl-based photosensitive resin.

Here, in the present embodiment, the partition wall 28 formed with a photosensitive resin is formed in order to set a state where each of the pixel electrodes 31R, 31G, and 31B is insulated from each other; however, each of the pixel electrodes 31R, 31G, and 31B may be divided using an inorganic insulating material such as a silicon oxide.

The functional layer 32 is formed so as to come into contact with each of the pixel electrodes 31R, 31G, and 31B using a vapor deposition process such as a vacuum vapor deposition method and a surface of the partition wall 28 is also covered by the functional layer 32. Here, since the functional layer 32 may be formed in a region which is divided by the partition wall 28, the functional layer 32 may or may not cover all of the surface of the partition wall 28. Thus, a top section of the partition wall 28 may or may not be covered by the functional layer 32.

The functional layer 32 has, for example, a hole injection layer, a hole transportation layer, an organic light emitting layer, an electron transportation layer, and an electron injection layer. In the present embodiment, the functional layer 32 is formed by forming and laminating in sequence each of a hole injection layer, a hole transportation layer, an organic light emitting layer, an electron transportation layer, and an electron injection layer with respect to the pixel electrode 31 using a vapor deposition process. Here, the layer configuration of the functional layer 32 is not limited thereto and an intermediate layer which controls movements of holes or electrons which are carriers may be further included and it is also possible to reduce the number of layers by, for example, the organic light emitting layer having a function of an electron transportation layer. The organic light emitting layer may have a configuration which is able to obtain white emitted light and for example, it is possible to adopt a configuration where an organic light emitting layer where red emitted light is obtained, an organic light emitting layer where green emitted light is obtained, and an organic light emitting layer where blue emitted light is obtained are combined.

The counter electrode 33 is formed as a common cathode covering the functional layer 32. The counter electrode 33 is formed by forming, for example, an alloy of Mg and Ag with an approximate film thickness (for example, 10 nm to 30 nm) at which it is possible to obtain light transmitting properties and light reflection properties. In the present embodiment, the light transmittance of the counter electrode 33 is preferably 20% or more and more preferably 30% or more, and the light reflectivity of the counter electrode 33 is preferably 20% or more, and more preferably 50% or more. Due to this, a plurality of the organic EL elements 30 are completed.

An optical resonator may be configured between the reflecting layer 25 and the counter electrode 33 for each of the sub pixels 18R, 18G, and 18B by forming the counter electrode 33 in a state of having light transmitting properties and light reflection properties. The optical resonator extracts light with a specific resonant wavelength by differentiating the optical distances between the reflecting layer 25 and the counter electrode 33 for each of the sub pixels 18R, 18G, and 18B. Due to this, it is possible to increase the color purity of the emitted light from each of the sub pixels 18R, 18G, and 18B. The optical distance described above is determined as a total of the products of the refractive indexes of various types of functional films, which are interposed between the reflecting layer 25 and the counter electrode 33 which configure the optical resonator, and the film thicknesses. Accordingly, as a method for differentiating the optical distances described above for each of the sub pixels 18R, 18G, and 18B, there is a method for differentiating the film thicknesses of the pixel electrodes 31R, 31G, and 31B or a method for differentiating the film thickness of the second interlayer insulating film 26 between the reflecting layer 25 and the pixel electrodes 31R, 31G, and 31B.

Next, the sealing layer 34 which covers a plurality of the organic EL elements 30 is formed in order to prevent moisture, oxygen, or the like from entering. The sealing layer 34 of the present embodiment is formed by a first sealing film 34a, a buffering film 34b, and a second sealing film 34c being laminated in sequence from the counter electrode 33 side. Here, the gas barrier properties of the sealing layer 34 are not particularly limited as long as it is possible to protect the organic EL element 30 from oxygen, water, and the like in the atmosphere; however, it is preferable that the oxygen permeability is 0.01 cc/m$^2$/day or less and it is preferable that the steam permeability is $7 \times 10^{-3}$ g/m$^2$/day or less, more preferably $5 \times 10^{-4}$ g/m$^2$/day or less, particularly preferably $5 \times 10^{-6}$ g/m$^2$/day or less. It is preferable that the light transmittance of the sealing layer 34 is 80% or more with respect to light irradiated from the counter electrode 33.

As the first sealing film 34a and the second sealing film 34c, for example, a silicon oxide film (SiO), a silicon nitride film (Si$_X$N$_Y$), a silicon oxynitride film (SiO$_X$N$_Y$), and films formed with these as main components, which are inorganic material having light transmittance and excellent gas barrier properties are preferable.

Examples of a method for forming the first sealing film 34a and the second sealing film 34c include a vacuum vapor deposition method, a sputtering method, a chemical vapor deposition (CVD) method, an ion plating method, and the like. The thicker the film thickness of the first sealing film 34a or the second sealing film 34c is, the higher the gas barrier properties that it is possible to realize; however, on the other hand, cracks are easily generated due to film stress which is generated due to expansion or contraction in the film. Accordingly, it is preferable to control each film to be within a film thickness of approximately 200 nm to 1000 nm and, in the present embodiment, high gas barrier properties are realized by interposing the buffering film 34b and overlapping the first sealing film 34a and the second sealing film 34c.

It is possible to form the buffering film 34b using, for example, an epoxy-based resin or a coating type inorganic material (silicon oxide and the like) with excellent thermal stability. In addition, when the buffering film 34b is coated and formed by a printing method such as a screen printing, a fixed-quantity discharge method, or the like, it is possible to planarize the surface of the buffering film 34b. In other words, the buffering film 34b is made to function as a planarizing layer which reduces the unevenness of the surface of the first sealing film 34a. The thickness of the buffering film 34b is 1 μm to 5 μm and more preferably in a range of 1.5 μm to 2.0 μm.

As shown in FIG. 4, an end section of the sealing layer 34 in a boundary with the terminal section 11t is mainly configured by the first sealing film 34a and the second sealing film 34c and does not have a configuration which interposes the buffering film 34b between the first sealing film 34a and the second sealing film 34c as the display region E1. Since considerable unevenness is generated in the display region E1 due to the structures of the pixel circuit 20, the organic EL element 30, or the like, it is necessary to reduce unevenness by interposing the buffering film 34b. On the other hand, this is because, since the organic EL element 30 or the like is not present in the dummy region E2, it is not particularly necessary to take the unevenness of the base into consideration. In addition, the end section of the sealing layer 34 described above is easily influenced by moisture or the like since the end section directly comes into contact with the outside. Therefore, it is possible for a configuration which has only the first sealing film 34a and the second sealing film 34c to realize higher gas barrier properties. Furthermore, since it is possible to configure the first sealing film 34a and the second sealing film 34c of the same material, mutual adhesion therebetween is great and it is possible to further increase the gas barrier properties.

Returning to FIG. 3, colored layers 36R, 36G, and 36B which correspond to each color of the sub pixels 18R, 18G, and 18B are formed on the sealing layer 34. Examples of a method for forming the color filter 36 which is configured by the colored layers 36R, 36G, and 36B include a method in which a photosensitive resin layer is formed by coating a photosensitive resin in which a coloring material such as a dye or a pigment which corresponds to each color is dispersed in a solvent and forms the color filter 36 by photographically exposing and developing the photosensitive resin layer using a photolithographic method. The film thicknesses of the colored layers 36R, 36G, and 36B may be the same for each color, or at least one color may be different from the other colors. In any case, the film thickness is set such that an appropriate chromaticity or white balance is obtained when light emitted from the organic EL element 30 passes through each of the colored layers (36R, 36G, and 36B).

Here, the colored layer 36G (the color filter 36) comes up to the display region E1 in FIG. 4; however, without being limited thereto, there may be a configuration where the colored layer 36G covers up to the dummy region E2 (a boundary between the terminal section 11t and the sealing substrate 41). According to this configuration, in a subsequent process which carries out the forming by coating the filler 42, the filler 42 does not come into contact with either the colored layer 36G (the color filter 36) or the second sealing film 34c, the wettabilities of which are different from each other, and it is possible to only coat the surface of the colored layer 36G (the color filter 36). In other words, this is because it is possible for the coating properties of the filler 42 to be more favorable.

Returning again to FIG. 3, the element substrate 10 and the sealing substrate 41 are arranged to oppose each other by being spaced at intervals and the filler 42 is coated in the intervals. A function of the filler 42 is to make the wettability and the adhesion of the sealing substrate 41 and the element substrate 10 favorable and additionally, it is necessary for the filler 42 to be transparent with respect to light emitted from the organic EL element 30. Therefore, examples of the filler 42 include a resin material such as a urethane-based resin, an acryl-based resin, an epoxy-based resin, and a polyolefin-based resin. The thickness of the filler 42 is, for example, 10 μm to 100 μm.

Next, with reference to FIG. 4, description will be given of the terminal section 11t of the element substrate 10 and the peripheral structure thereof. As shown in FIG. 4, the mounting terminals 101 are formed on the second interlayer insulating film 26 in the same manner as the pixel electrode 31 in the terminal section 11t of the element substrate 10. In addition, the mounting terminals 101 are connected with a wiring layer 103 which is formed on the first interlayer insulating film 24 via a conductive film in a contact hole 26a which is formed in the second interlayer insulating film 26. The configuration of peripheral circuits such as the pixel circuit 20 on the base material 11, signal wiring which is connected with the pixel circuit 20, the scan line driving circuit 15, and the like is omitted in FIG. 4; however, each of the plurality of the mounting terminals 101 is electrically connected with respect to these circuits or the signal wiring via the wiring layer 103.

The wiring layer 103 is preferably patterned with the reflecting layer 25 using a conductive film which is formed on the first interlayer insulating film 24; however, the wiring layer 103 may be formed of a material which has a different configuration from the reflecting layer 25.

In addition, the mounting terminals 101 are preferably patterned with the pixel electrode 31 using a conductive film which is formed on the second interlayer insulating film 26; however, the mounting terminals 101 may be formed of a material which has a different configuration from the pixel electrode 31. The mounting terminals 101 may be mounted by wire bonding and the like in addition to being connected with the FPC 105 described above (FIG. 2). Aluminum (Al), indium tin oxide (ITO), or the like may be used for the mounting terminals 101 in consideration of compatibility with the mounting method and durability with respect to dry etching which uses a fluorine-based etching gas in a subsequent sealing film etching process.

In any terminal configuration, since the mounting terminals 101 hold an exposed state without interfering with, for example, the sealing layer 34, the filler 42, and the other members on the upper surface of the second interlayer insulating film 26, it is possible to obtain a favorable electrical connection with the outside.

Method for Manufacturing Organic EL Apparatus

Next, with regard to the method for forming the organic EL apparatus of the present embodiment, detailed description will be given of a method for forming the mounting terminals 101 with high connection reliability which is a feature of the invention with reference to FIG. 5 to FIG. 7B.

Figure 5:
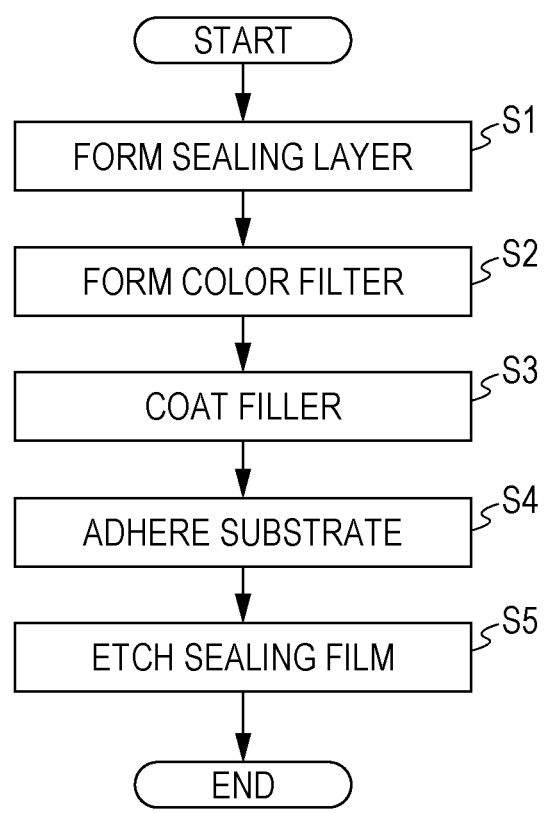
FIG. 5 is a flowchart which shows a method for manufacturing an organic EL apparatus according to the first embodiment.

FIG. 5 is a flowchart which shows a method for manufacturing the organic EL apparatus 100 and FIGS. 6A to 6C and FIGS. 7A and 7B are schematic cross-sectional diagrams which show a method for manufacturing the organic EL apparatus 100. Here, FIGS. 6A to 6C and FIGS. 7A and 7B are schematic cross-sectional diagrams in the region which corresponds to FIG. 4.

As shown in FIG. 5, a method for manufacturing the organic EL apparatus 100 in the present embodiment includes a sealing layer forming process (step S1), a color filter forming process (step S2), a filler coating process (step S3), a substrate adhering process (step S4), and a sealing film etching process (step S5).

Here, it is possible to adopt a forming technique, a hole filling technique, a planarizing technique, and other related processes known in the art for the method for forming the pixel circuit 20, the reflecting layer 25, the organic EL element 30, the other peripheral circuits, the signal wiring, and the like on the base material 11.

Sealing Layer Forming Process (Step S1)

Figure 6A:
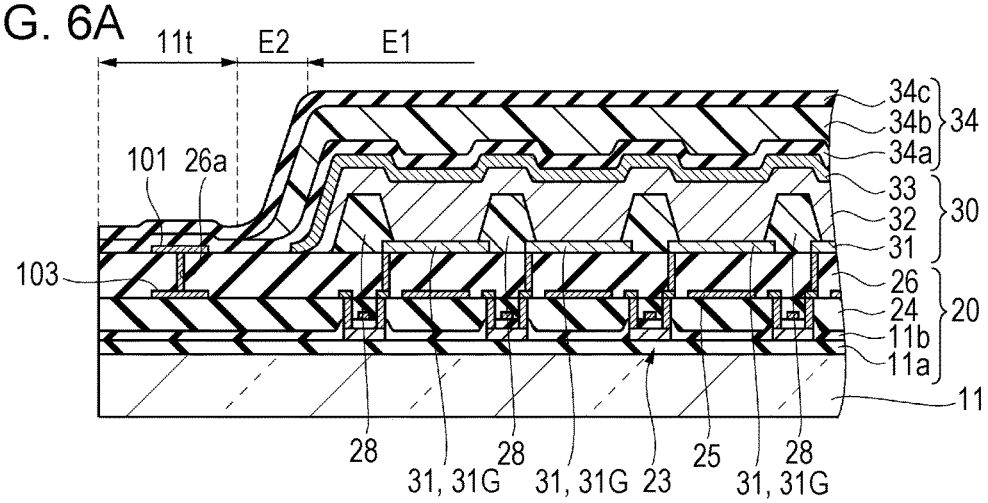
FIGS. 6A to 6C are schematic cross-sectional diagrams which show a method for manufacturing an organic EL apparatus according to the first embodiment.

As shown in FIG. 6A, firstly, the first sealing film 34a which covers the counter electrode 33 and the terminal section lit (the mounting terminals 101) is formed. Examples of the method for forming the first sealing film 34a include a method for forming a silicon oxide film (SiO), a silicon nitride film ($Si_XN_Y$), or a silicon oxynitride film ($SiO_XN_Y$) by a vacuum vapor deposition method, a sputtering method, a CVD method, an ion plating method, and the like. It is desirable that the film thickness of the first sealing film 34a is within a range of approximately 200 nm to 1000 nm and in this case, the film thickness is set to 400 nm.

Next, the buffering film 34b which covers the first sealing film 34a is formed. It is desirable that the buffering film 34b is formed so as to be within the dummy region E2 without overlapping a boundary between the terminal section 11t and the sealing substrate 41. As a method for forming the buffering film 34b, for example, the buffering film 34b formed with an epoxy resin is formed by using a solution which includes an epoxy resin having transparency and a solvent for the epoxy resin, coating the solution using a printing method or a fixed-quantity discharge method, and carrying out drying. The film thickness of the buffering film 34b is preferably 1 μm to 5 μm and more preferably 1.5 μm to 2.0 μm. In this case, the film thickness is set to 2 μm.

Here, the buffering film 34b is not limited to being formed using an organic material such as an epoxy resin. For example, by coating a coating type inorganic material using a printing method and drying and sintering the result, a silicon oxide film with a film thickness of approximately 2 μm may be formed as the buffering film 34b.

Subsequently, the second sealing film 34c which covers the buffering film 34b is formed. Examples of the method for forming the second sealing film 34c are the same as for the first sealing film 34a and include a method for forming a silicon oxide film (SiO), a silicon nitride film ($Si_XN_Y$), or a silicon oxynitride film ($SiO_XN_Y$) using a vacuum vapor deposition method, a sputtering method, a CVD method, an ion plating method, or the like. It is desirable that the film thickness of the second sealing film 34c is also within a range of approximately 200 nm to 1000 nm and, in this case, the film thickness is set to 800 nm. Then, the process proceeds to step S2.

Color Filter Forming Process (Step S2)

Figure 6B:
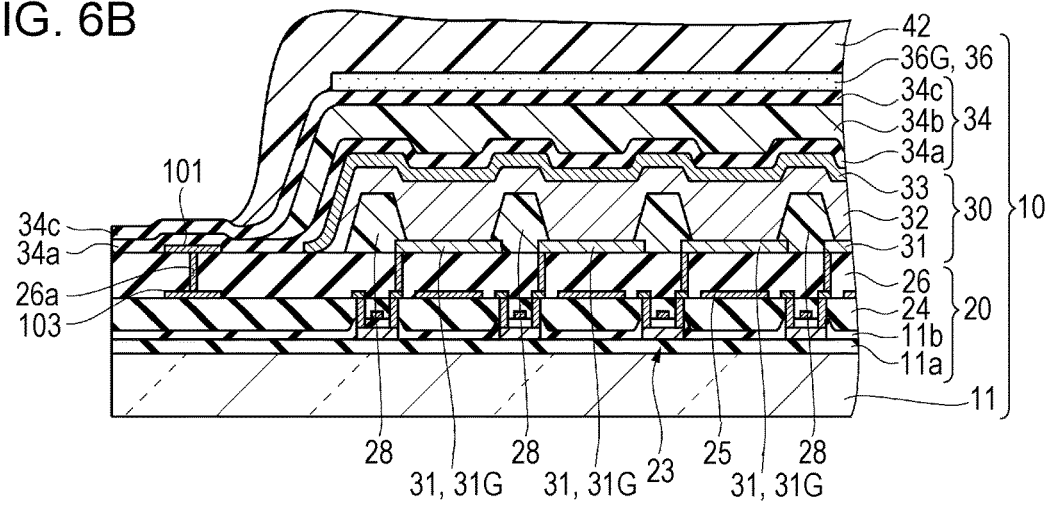
Figure 6C:
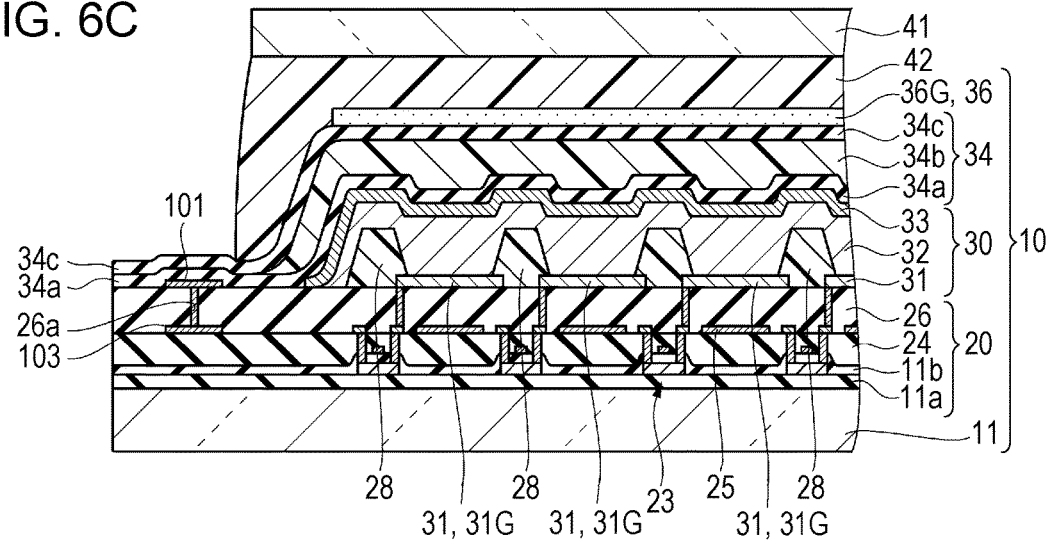

As shown in FIG. 6B, a photosensitive resin layer is formed by coating and drying a photosensitive resin which includes, for example, a green coloring material using a spin coating method. Subsequently, the green (G) colored layer 36G is formed by photographically exposing and developing the photosensitive resin layer. In the present embodiment, in order to obtain appropriate optical characteristics, the film thickness of the colored layer 36G is in a range of 1.0 μm to 2.0 μm. In addition, although not shown in the diagram, the colored layers 36R and 36B are formed by coating a photosensitive resin which includes coloring materials of each color in the same manner for red and blue and performing photographic exposure and development thereon. That is, it is necessary to perform the coating to photographic exposure and development processes a number of times according to the number of colors of the color filters to be used. Subsequently, the process proceeds to step S3.

Filler Coating Process (Step S3)

As shown in FIG. 6B, the filler 42 is coated so as to cover the colored layer 36G (36). A thermosetting type epoxy-based resin is used for the filler 42 in consideration of the transmitting properties of light which is emitted from the organic EL element 30 and adhesion between the color filter 36 and the sealing substrate 41. The same effect is obtained even with other resin materials, for example, such as a urethane-based resin, an acryl-based resin, and a polyolefin-based resin. Since the unevenness of a structure, for example, such as the organic EL element 30, is reduced due to the effect of the buffering film 34b, it is possible to coat the filler 42 on a surface of the color filter 36 or the second sealing film 34c with good flowability. Here, the final thickness of the filler 42 is approximately 10 μm to 100 μm. Subsequently, the process proceeds to step S4.

Sealing Substrate Adhering Process (Step S4)

The sealing substrate 41 is arranged (FIG. 6C) at a predetermined position, for example, by vacuum suction or the like, to oppose the base material 11 where the filler 42 is coated in FIG. 6B. Quartz glass is used for the sealing substrate 41 in consideration of the transmitting properties, the handling properties, or the influence of a reaction product due to a subsequent sealing film etching process. The thickness of the sealing substrate 41 is suitably 0.5 mm to 1.2 mm. A substrate of 0.7 mm is used in the present embodiment.

Pressure is applied to the sealing substrate 41 which is arranged opposite at a predetermined pressure and the filler 42 which is interposed between the base material 11 and the sealing substrate 41 and which is still not solidified is evenly spread out in plan view. At this time, there is also a concern that the filler 42 may protrude from an end section of the sealing substrate 41 (a boundary surface with the terminal section 11t), overlap the terminal section 11t, and cover up to the mounting terminals 101. Accordingly, it is preferable to manage the filler 42 such that the filler 42 does not protrude to the terminal section 11t by adjustment of the coating amount of the filler 42, the planar area of the sealing substrate 41, and the degree of pressure. Incidentally, since there is also a possibility that display defects will be caused when there are residual bubbles in the filler 42, it is more preferable to perform the pressurizing work in a vacuum (atmospheric pressure or less) atmosphere.

After the work described above, the filler 42 is solidified at the temperature and time which are conditions for curing the filler 42 and the element substrate 10 and the sealing substrate 41 are adhered. Here, in order to make the filler 42 planarly extend by applying pressure to the sealing substrate 41, it is not particularly desirable to coat the filler 42 on the entire display region E1 in step S3 described above. Subsequently, the process continues to step S5.

Sealing Film Etching Process (Step S5)

Figure 7A:
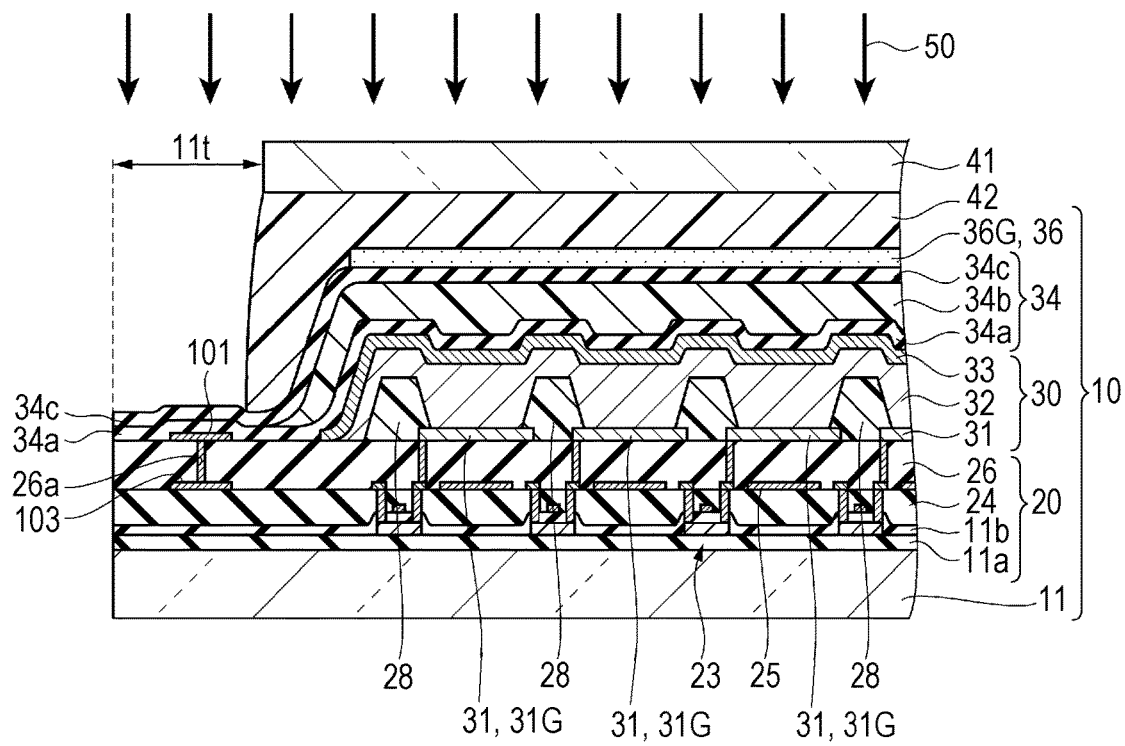
FIGS. 7A and 7B are schematic cross-sectional diagrams which show a method for manufacturing an organic EL apparatus according to the first embodiment.
Figure 7B:
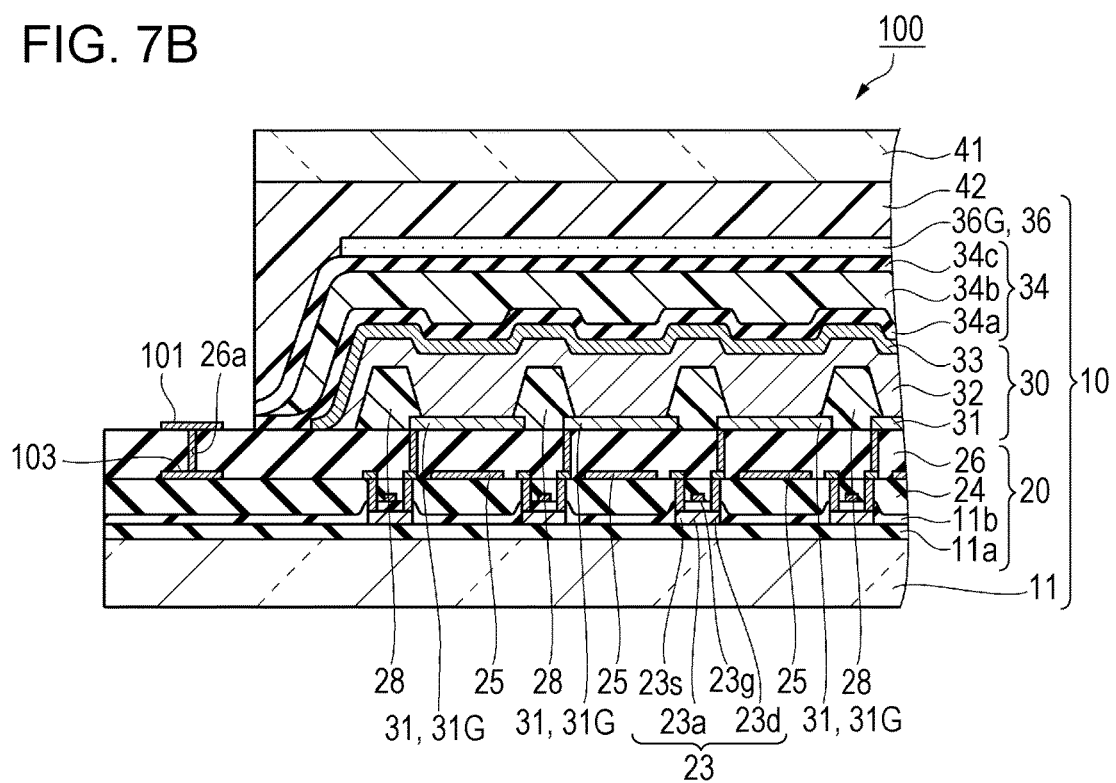

As shown in FIG. 7A, the first sealing film 34a and the second sealing film 34c which cover the terminal section 11t are etched after setting the sealing substrate 41 as a mask. Examples of a method for selectively etching the first sealing film 34a and the second sealing film 34c formed with an inorganic film such as a silicon oxide film (SiO), a silicon nitride film ($Si_xN_y$), a silicon oxynitride film ($SiO_xN_y$), or the like include dry etching which uses a fluorine-based processing gas such as $CHF_3$ (methane trifluoride), $CF_4$ (carbon tetrafluoride), $NF_3$ (nitrogen trifluoride), and $SF_6$ (sulfur hexafluoride). The dry etching is performed by applying a high frequency voltage under a predetermined gas flow rate and chamber pressure. By the sealing films (34a and 34c) or the sealing substrate 41 being irradiated with plasma particles (arrows 50 in FIG. 7A) according to the gas type and a volatile substance being generated due to a chemical reaction occurring between the plasma particles and the sealing films (34a and 34c), which are the materials to be irradiated, and the like, the material to be irradiated is removed.

In the terminal section 11t (the mounting terminals 101), the first sealing film 34a and the second sealing film 34c are overlapped. Then, both of the sealing films (34a and 34c) are any of a silicon oxide film (SiO), a silicon nitride film ($Si_xN_y$), or a silicon oxynitride film ($SiO_xN_y$) and have Si or SiO as a main component. Thus, it is possible to remove the first sealing film 34a and the second sealing film 34c as a batch by the same type of etching gas. On the other hand, the sealing substrate 41 which becomes a mask is configured of quartz glass as described above. Naturally, since quartz glass is also configured of SiO, the quartz glass is etched in the same manner when etching the sealing films (34a and 34c).

In the present embodiment, the film thickness of the sealing films (34a and 34c) is approximately 1200 nm (thickness of the first sealing film 34a: 400 nm+thickness of the second sealing film 34c: 800 nm) and, on the other hand, the thickness of the sealing substrate 41 is 700 μm. Thus, the sealing substrate 41 has a thickness sufficient for the removal of the sealing films (34a and 34c) and functions as a mask in a sealing film etching process.

Aluminum (Al) or indium tin oxide (ITO) is used for the mounting terminals 101 as described above. Thus, after removing the sealing films (34a and 34c) which cover the terminal section lit, the mounting terminals 101 themselves become a favorable etching stop material and the mounting terminals 101 are protected with respect to the sealing film etching process.

Here, there is also a possibility that the etching rate will not be unconditionally determined just by the material due to the difference in the heights at which the mounting terminals 101 and the sealing substrate 41 are positioned.

Subsequently, the influence on the terminal section lit is considered in a case where the quartz glass which becomes the sealing substrate 41 is etched. Quartz glass becomes a volatile substance such as $SiF_4$ or $CO_X$ according to the following reaction formula (1) by etching which uses, for example, $CF_4$. In the formula (1), "*" represents a radical and "↑" represents volatilizing.

$$SiO_2 + CF_4 + F^* = SiF_4\uparrow + CO_X\uparrow \qquad (1)$$

In order to continue the etching, it is necessary to constantly exhaust the gas in the process while continuously bringing in the etching gas. Therefore, a volatile substance such as $SiF_4$ or $CO_X$ which is generated in the sealing film etching process is also constantly exhausted. Thus, elements which occur in the composition of the sealing substrate 41 which is a mask and other compounds are not accumulated in the terminal section lit. In other words, elements and the like which occur in the composition of the sealing substrate 41 are also not accumulated on the surface of the mounting terminals 101 after removing the sealing films (34a and 34c). Thus, it is possible to realize a surface state of the mounting terminals 101 with high connection reliability.

Here, in a case of using the sealing substrate 41 as a mask, it is also necessary to inspect the light transmitting properties of the sealing substrate 41 itself before and after the sealing film etching process. This is because a surface of the sealing substrate 41 is also etched as shown in the previous formula (1) and there is a possibility that minute unevenness will be generated on the surface. According to the results of measuring the light transmittance of the sealing substrate 41, the degree of decrease in the light transmittance before and after the sealing film etching process is less than 1%. For this reason, using quartz glass as a mask is also sufficiently effective in terms of the optical characteristics.

Next, as one example of the sealing substrate 41, a case will be described of using a glass which includes components other than an SiO component and SiO and which is easily obtained, for example, non-alkali glass, as the sealing substrate 41 instead of the quartz glass which is used in the present embodiment. Here, this experiment is the same as in the etching process apart from the difference in the material of the sealing substrate 41.

In the same process, after etching the sealing films (34a and 34c) of the terminal section lit, confirmation of the terminal section lit was performed. By doing this, a visible deposit, which is separated when wiping the terminal section lit with ethanol or the like, remained on the terminal section lit, although recognition was not possible under a stereomicroscope. Then, when carrying out a composition analysis of the deposit, calcium (Ca), an oxide of aluminum (Al), and a fluoride (a reaction product with an etching gas) were confirmed. These elements are elements which are contained in the non-alkali glass and cause contamination of the terminal section lit. Thus, when a glass which includes components other than SiO is set as a second substrate and is used as a mask in the sealing film etching process, it is necessary to further add a physical or chemical cleaning process for the terminal section 11t.

On the other hand, in a case of using quartz glass as a mask as in the present embodiment, reaction products which are derived from the composition of the quartz glass as described above are not accumulated in the terminal section 11t. That is, in the state after the sealing film etching process, it is possible to realize a surface state of the mounting terminals 101 which is already favorable for connection with the FPC 105.

After exposing the terminal section 11t (the mounting terminals 101) of the element substrate 10 in the process described above (FIG. 7B), the FPC 105 is mounted in the mounting terminals 101 as shown in FIG. 2 and the organic EL apparatus 100 is completed.

For the method for manufacturing the organic EL apparatus 100 described above, description was given with one organic EL apparatus 100 as a unit; however, in practice, simultaneously forming a plurality of organic EL panels (in a state before the FPC 105 is mounted) in the organic EL apparatus 100 may be considered. Below, description will be given of an example which uses a mother substrate.

Figure 8A:
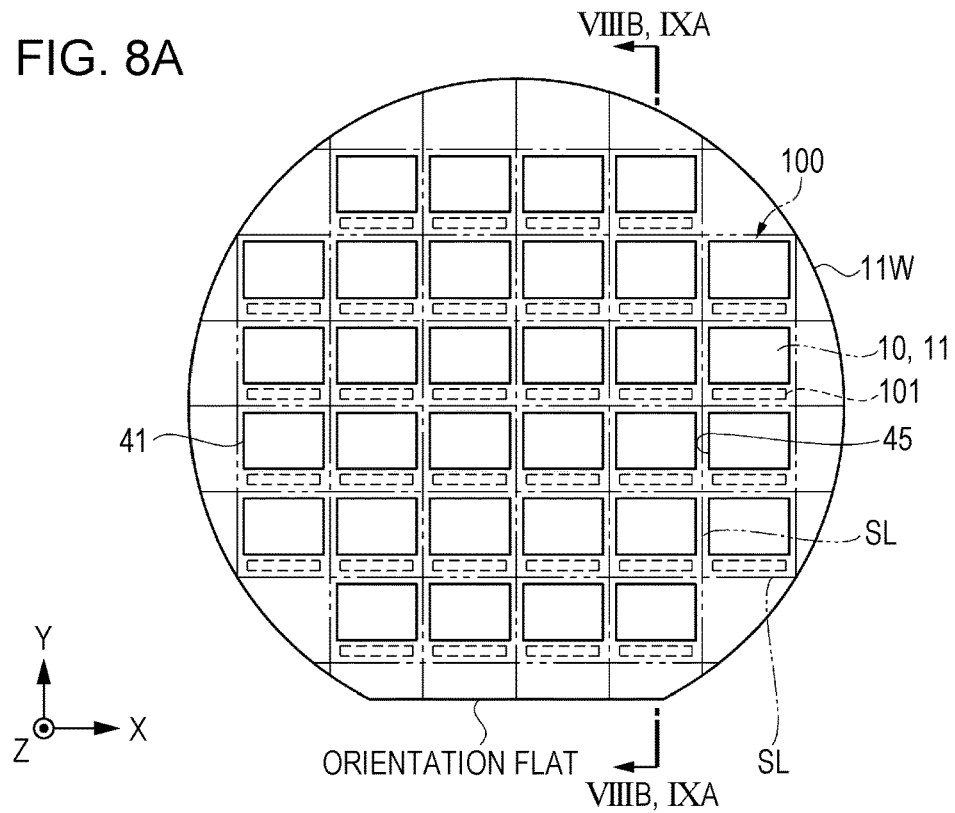
FIGS. 8A to 8C are schematic diagrams which show a mother substrate of an organic EL apparatus according to the first embodiment.
Figure 8B:
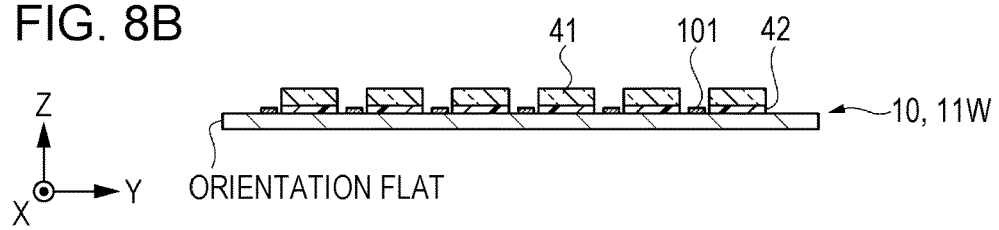
Figure 8C:
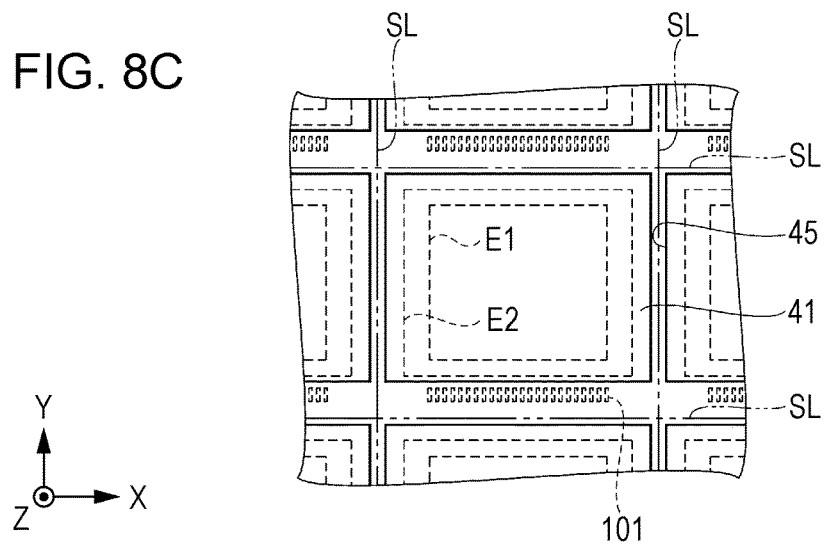

FIG. 8A is a schematic planar diagram which shows a mother substrate where a plurality of the element substrates 10 are placed (laid out) on a surface and the sealing substrates 41 are respectively arranged, FIG. 8B is a schematic cross-sectional diagram of line VIIIB-VIIIB in FIG. 8A, and FIG. 8C is a partially enlarged diagram in FIG. 8A.

As shown in FIG. 8A, a mother substrate 11W is, for example, a quartz glass substrate in a wafer form and, in terms of size, for example, has a diameter of 200 mm to 300 mm and an orientation flat which represents a plane orientation is provided by cutting out a part of the periphery. With the orientation flat as a reference, an X direction, a Y direction, and a Z direction which is orthogonal thereto are set. Scribe lines used when finally carrying out fragmenting into the organic EL apparatuses 100 are denoted by SL. Here, since the organic EL apparatus 100 of the present embodiment is a top emission type, as described above, it is possible to use not only a transparent quartz glass substrate, but also, for example, an opaque silicon substrate for the base material 11 of the element substrate 10. In other words, it is also possible to use a silicon wafer as the mother substrate 11W.

In the mother substrate 11W, the element substrate 10 is formed in a state where a plurality of the base materials 11 are placed on a surface in a matrix form. With regard to the element substrate 10 where a plurality of the organic EL elements 30 are formed, the sealing layer 34 is formed in the sealing layer forming process (step S1). Subsequently, the color filters 36 (the colored layers 36R, 36G, and 36B) are formed in the color filter forming process of step S2. Subsequently, in the filler coating process (step S3), the filler 42 is coated with respect to each of the element substrates 10 in a completed state.

In the substrate adhering process (step S4), the sealing substrate 41 is overlapped with the element substrate 10 while being aligned therewith. The sealing substrate 41 is arranged so as not to cover the terminal section 11t (the mounting terminals 101) (FIGS. 8A to 8C). Then, the element substrate 10 and the sealing substrate 41 are adhered by heating and curing the thermosetting type filler 42.

In the sealing film etching process (step S5), after setting the sealing substrate 41 as a mask, the sealing films (34a and 34c) which cover the terminal section 11t are removed by etching. At this time, not only the sealing films (34a and 34c) which cover the terminal section 11t, but also the sealing films (34a and 34c) in a portion (a slit section 45) which is not covered by the sealing substrate 41 on the mother substrate 11W are also removed. That is, the sealing films (34a and 34c) on the scribe line SL are in a state of being removed.

After that, by cutting the mother substrate 11W along the virtual scribe lines SL between the adjacent element substrates 10, the individual fragmented organic EL apparatuses 100 are extracted. Since the sealing films (34a and 34c) on the scribe line SL are removed in the sealing film etching process, when cutting the mother substrate 11W, for example, the sealing films (34a and 34c) are not often wound due to the rotation of the cutting blade. Thus, since it is possible to reduce the generation of cracks or peeling in the sealing films (34a and 34c) on an outer edge side of the element substrate 10, it is possible to maintain favorable gas barrier properties. Incidentally, examples of a cutting method include a line inserting scribe method which uses a cemented carbide tip or a diamond tip, or a dicing method which uses a diamond blade.

Here, a method for manufacturing the organic EL apparatus 100 which uses the mother substrate 11W is not limited only to the element substrate 10 side. That is, application is also possible to a method in which the mother substrate 11W on which the element substrate 10 is placed and a mother substrate for sealing on which the sealing substrate 41 is placed are adhered and cutting is carried out thereon.

Figure 9A:
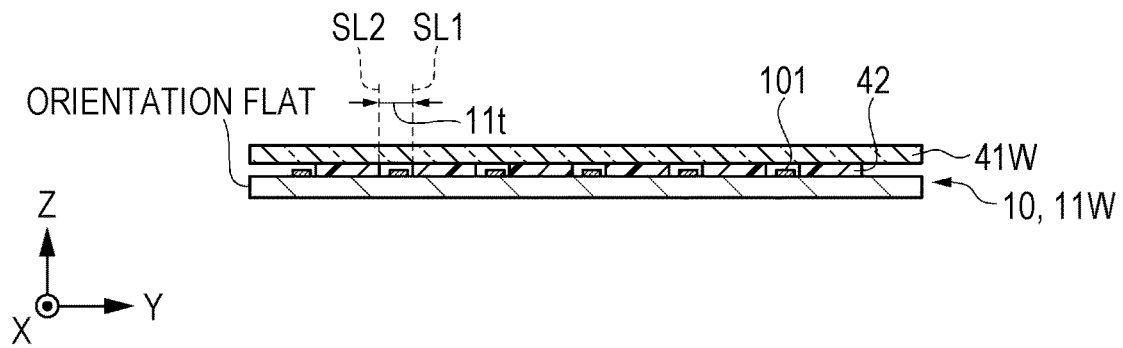
FIGS. 9A to 9C are schematic diagrams which show other methods for manufacturing an organic EL apparatus according to the first embodiment.
Figure 9B:
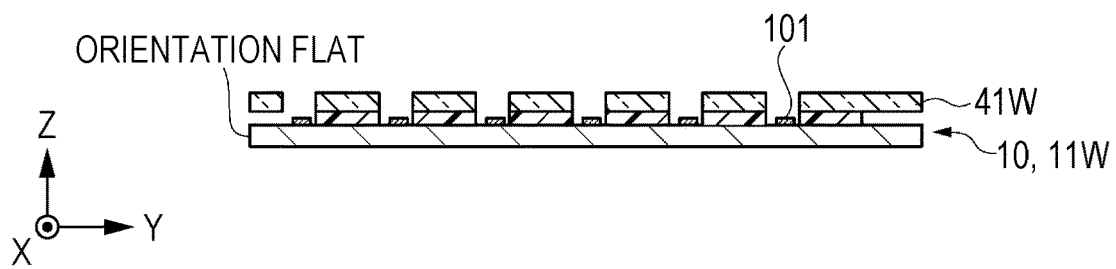
Figure 9C:
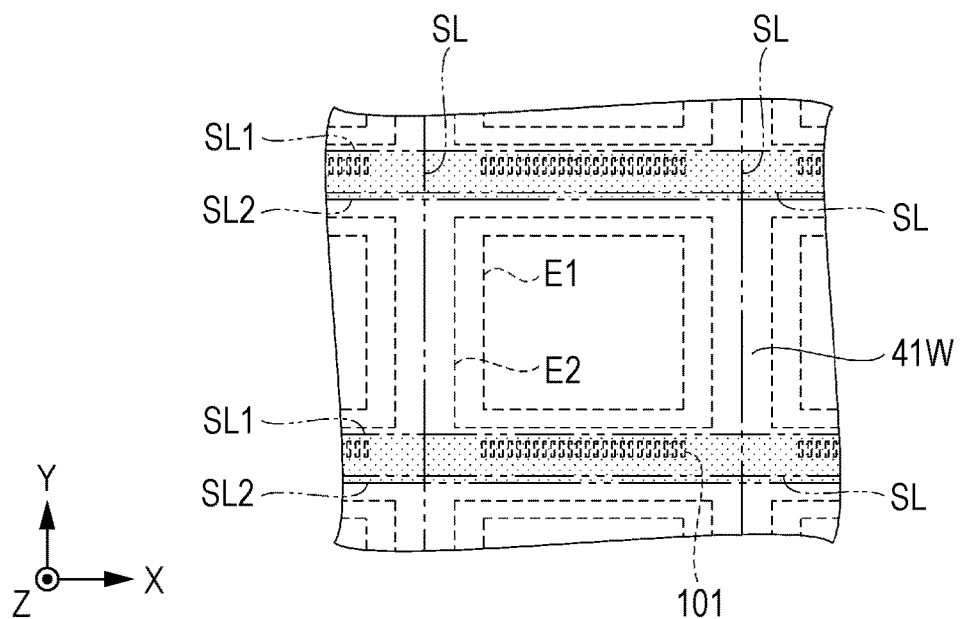

FIGS. 9A to 9C are schematic diagrams which show another method for manufacturing the organic EL apparatus 100 in a state where the mother substrate 11W and a sealing mother substrate 41W are adhered. FIG. 9A is a schematic cross-sectional diagram in a part which corresponds to the line IXA-IXA cross-section in FIG. 8A. FIG. 9B is a schematic cross-sectional diagram where the sealing mother substrate 41W which is in a region which overlaps the terminal section 11t in FIG. 9A is removed by scribing. FIG. 9C is a partially enlarged diagram which corresponds to FIG. 8C.

In a case of using the sealing mother substrate 41W on which no processes are carried out, in a state after adhering with the mother substrate 11W, the sealing mother substrate 41W is in a state of covering the terminal section 11t (FIG. 9A). Then, since the terminal section 11t is not covered by the filler 42 as described above, the sealing mother substrate 41W and the terminal section 11t are not adhered via the filler 42.

Here, in order to perform the sealing film etching process in step S5, it is necessary to remove the sealing mother substrate 41W which overlaps at least the terminal section 11t. To do this, firstly, the positions of a line SL 1 and a line SL 2 are determined to approximately the width of the terminal section 11t (which is wider than both ends of the mounting terminals 101 in the Y direction) (FIGS. 9A and 9C). Subsequently, scribing is carried out along the line SL 1 and the line SL 2 so as to cross from one end to the other end in the X direction of the sealing mother substrate 41W. This is repeated for a number of rows in the Y direction of the mounting terminals 101.

Cracks are generated in the thickness direction (the Z direction) of the sealing mother substrate 41W under the scribed line SL 1 and line SL 2. Due to these cracks, the sealing mother substrate 41W is cut into a plurality on the line SL 1 and the line SL 2. Then, since the terminal section 11t is not covered by the filler 42, it is possible to remove the sealing mother substrate 41W which overlaps the terminal section lit by suction or the like and it is possible to easily expose the terminal section lit (the dot hatched sections in FIG. 9B and FIG. 9C).

Since the present scribe is able to execute dry cutting which does not use moisture, for example, it is possible to use the scribe without a drying process or the like. Here, wet scribes are not excluded.

In this manner, after removing the sealing mother substrate 41W which overlaps the terminal section lit, the process proceeds to the sealing film etching process in step S5, the organic EL apparatus 100 is manufactured using the method described above.

As described above, according to the first embodiment, the following effects are obtained.

(1) When etching the first sealing film 34a and the second sealing film 34c which cover the terminal section lit, the sealing substrate 41 which is configured of quartz glass is used as an etching mask. A part of the surface of quartz glass which is the mask is also etched; however, this part is exhausted as a volatile substance. Thus, in the sealing film etching process, an etching residue which is caused by the sealing substrate 41 does not contaminate the terminal section lit. In other words, the surfaces of the mounting terminals 101 which are formed in the terminal section lit are not contaminated. That is, it is possible to manufacture and provide the organic EL apparatus 100 with highly reliable connectivity in the electrical connection between the mounting terminals 101 and the FPC 105.

(2) Since it is possible to prevent contamination of the surface of the mounting terminals 101, additional physical or chemical cleaning is not necessary and it is possible to reduce the number of processes. Thus, it is possible to manufacture the organic EL apparatus 100 at a lower cost.

(3) In a case of configuring the organic EL apparatus 100 using the mother substrate 11W and the sealing substrate 41 (FIGS. 8A to 8C), in the sealing film etching process (step S5), not only the sealing films (34a and 34c) which overlap the terminal section lit, but also the sealing films (34a and 34c) which cover the slit section 45 along the scribe line SL are etched. That is, in a phase before cutting the mother substrate 11W, the sealing films (34a and 34c) on the scribe lines SL are removed. In other words, when cutting the mother substrate 11W, it is possible to reduce the generation of cracks or peeling in the sealing films (34a and 34c) on an outer edge side of the element substrate 10. Thus, it is possible to provide the organic EL apparatus 100 with favorable gas barrier properties where a space for moisture or the like to enter is suppressed as much as possible.

Second Embodiment

Organic EL Apparatus

Figure 10:
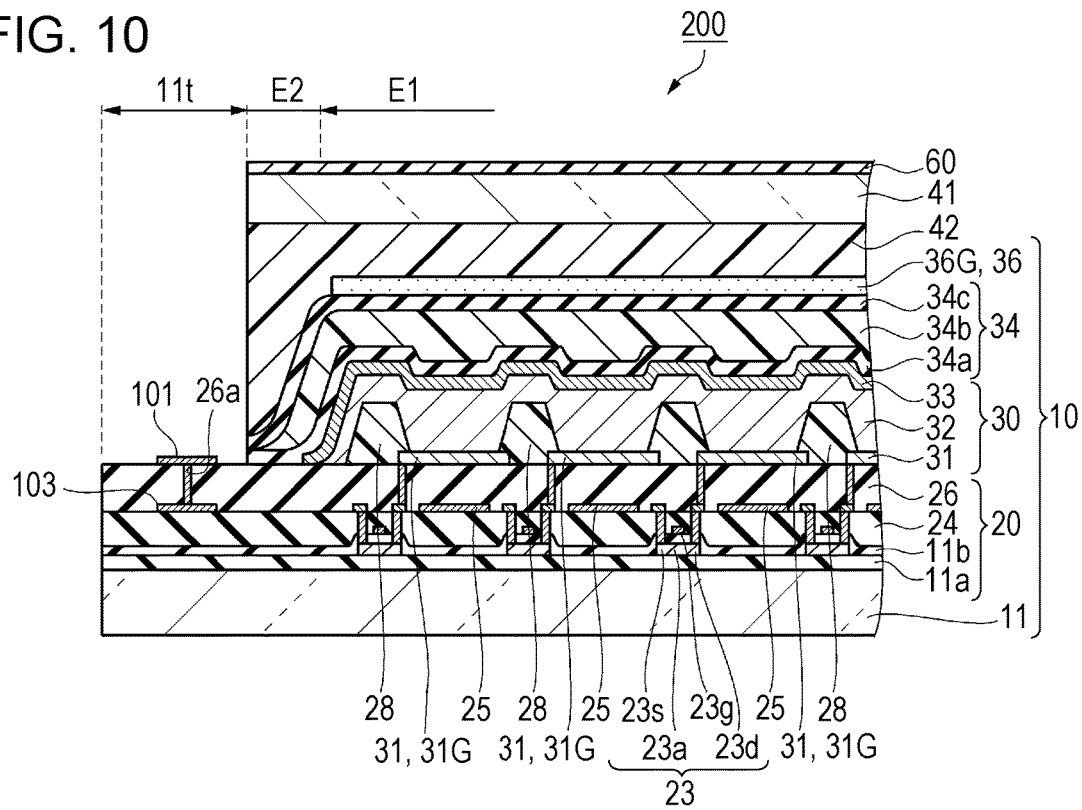
FIG. 10 is a schematic cross-sectional diagram which shows a structure of an organic EL apparatus according to a second embodiment and is equivalent to the line X-X in FIG. 2.
Figure 11:
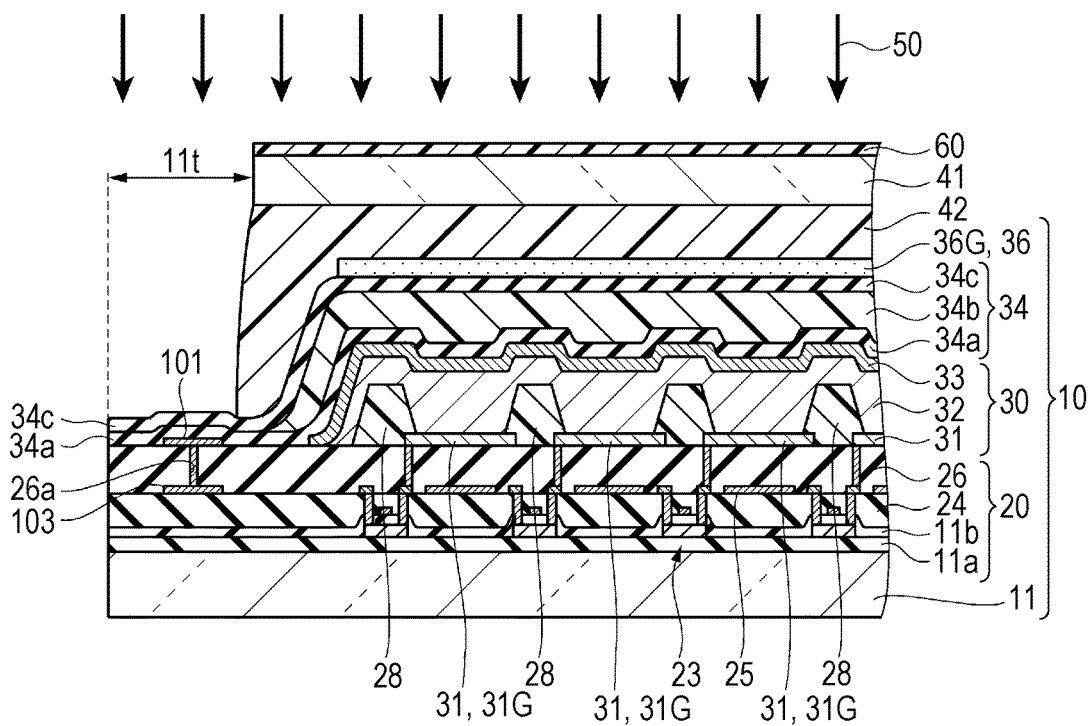
FIG. 11 is a diagram for illustrating a method for manufacturing an organic EL apparatus according to the second embodiment.

Next, description will be given of an organic EL apparatus according to the second embodiment using FIG. 10 and FIG. 11. FIG. 10 is a schematic cross-sectional diagram which shows a structure of an organic EL apparatus of the second embodiment and FIG. 11 is a diagram for illustrating a method for manufacturing the organic EL apparatus of the second embodiment. FIG. 10 is a diagram which is equivalent to FIG. 4 of the first embodiment and FIG. 11 is a diagram which is equivalent to FIG. 7A of the first embodiment.

The difference of the configuration of the second embodiment from the first embodiment is that a protective member 60 is formed on an upper section of the sealing substrate 41 (a surface opposite to a surface where the filler 42 is adhered with respect to the sealing substrate 41). Therefore, the same reference numerals are given to the same configuration as the first embodiment and description thereof will be omitted.

In FIG. 10 and FIG. 11, the protective member 60 is formed on an upper section of the sealing substrate 41. Then, the protective member 60 is used for protecting the sealing substrate 41 in a sealing film etching process. Here, in FIG. 10 and FIG. 11, the protective member 60 is formed so as to cover the entire surface of the sealing substrate 41; however, it is not necessary for the protective member 60 to be formed over the entire surface. For example, even when formed only in the vicinity of the terminal section lit on the upper section of the sealing substrate 41, the effects are exhibited in the present embodiment.

Below, description will be given of a detailed aspect of the protective member 60 which is able to be used in the present embodiment.

First Configuration: Protective Member 60 is Photosensitive Resin

According to a first configuration, it is possible to use a photosensitive resin for the protective member 60. The photosensitive resin refers to a polymer material which includes carbon (C), oxygen (O), and hydrogen (H) as a main element and here, from the viewpoint of the etching resistance in a sealing film etching process, a novolac-based resin or a polyethylene-based resin are particularly preferable.

A fluorine-based gas which is used in a sealing film etching process also functions as an etchant with respect to the photosensitive resin described above. Then, the etching resistance changes according to differences in the amount of contained carbon. Generally, in a polymer material which has a large amount of carbons, the etching resistance with respect to a fluorine-based gas is high compared to an inorganic material which does not contain carbon (C). In other words, the etching rate is low.

For this reason, an etching rate of a photosensitive resin which includes carbon as a main constituent element is lower than the etching rate with respect to the sealing films (34a and 34c) which are configured of Si-based and SiO-based inorganic materials. In other words, the photosensitive resin is favorable as a mask for etching the sealing films (34a and 34c).

That the etching rate of a photosensitive resin is lower than that of the sealing films (34a and 34c) is, in other words, that an etching residue of the photosensitive resin is also relatively small. Thus, it is also possible to reduce contamination due to the etching residue of the photosensitive resin which is the protective member 60 with respect to the mounting terminals 101 after removing the sealing films (34a and 34c).

Here, even when the etching residue of the photosensitive resin is attached to the mounting terminals 101, since the etching residue here is an organic material which has carbon (C), oxygen (O), and hydrogen (H) as a main component, removal is possible, for example, by easily dissolving the etching residue using an organic solvent such as acetone.

In addition, since the protective member 60 is formed on the sealing substrate 41, it is possible to protect the surface of the sealing substrate 41 in the sealing film etching process. Therefore, the sealing substrate 41 is not directly irradiated with plasma particles due to an etching gas and a residue is not generated due to etching from the sealing substrate 41. Thus, as long as the material is transparent with respect to light emitted from the organic EL element 30, it is possible to select any material as a candidate of the sealing substrate 41. That is, it is possible to use not only quartz glass, but also another silicate glass such as soda glass or non-alkali glass which has SiO as a main component.

It is possible to use a so-called spin coating method as a method for forming a photosensitive resin which is the protective member 60 on the sealing substrate 41. Below, this method will be described.

As described in FIG. 9A of the first embodiment, the mother substrate 11W and the sealing mother substrate 41W are adhered and fixed via the filler 42. In a fixed state, a resist liquid where a photosensitive resin and an organic solvent are mixed is dropped on the sealing mother substrate 41W and the sealing mother substrate 41W is rotated at a high speed. Due to centrifugal force which works by high-speed rotation, the resist liquid is coated on the sealing mother substrate 41W with a substantially uniform thickness. It is possible to adjust the film thickness of the resist liquid using certain conditions such as the number of rotations, the droplet amount of the resist liquid, the viscosity of the resist liquid, and the like. In the present embodiment, from the viewpoint of resistance as an etching mask with respect to the sealing films (34a and 34c), the range is 1.0 μm to 5.0 μm.

Subsequently, a photosensitive resin is formed on the sealing mother substrate 41W by heating at a temperature according to the properties of the resist liquid and volatilizing the solvent.

Here, with regard to the photosensitive resin after coating, it is also possible to remove a portion which is equivalent to the scribe lines (SL, SL 1, and SL 2) described in FIG. 9A and FIG. 9C by photographic exposure and development. However, since the presence or absence of the photosensitive resin does not influence the scribe which is a target of a scribe process, removal is not necessary.

As described above, a photosensitive resin is formed on the sealing mother substrate 41W.

After that, the terminal section 1it is exposed by scribing the sealing mother substrate 41W (FIG. 9B), the process proceeds to the sealing film etching process (FIG. 11), and the sealing films (34a and 34c) are removed (FIG. 10).

At the time of removing the sealing films (34a and 34c) in the sealing film etching process, the photosensitive resin is formed as is on the sealing mother substrate 41W. In a case of being operated as an organic EL apparatus 200 in this state, with respect to light emitted from the organic EL element 30, a part of the light with a wavelength according to the absorption characteristics of the photosensitive resin is absorbed and it is not possible to obtain a desired brightness. For this reason, it is necessary to remove the photosensitive resin after the sealing film etching process. The use of asking, which uses oxygen plasma, is favorable for removing the photosensitive resin. Ashing is a method for decomposing the photosensitive resin into mainly carbon dioxide ($CO_2$) and moisture ($H_2O$) by irradiating the photosensitive resin with oxygen plasma. Since the carbon dioxide ($CO_2$) or moisture ($H_2O$) volatilizes, reaction products of the photosensitive resin due to asking do not contaminate the terminal section 1it (the mounting terminals 101).

Subsequently, in the same manner as the first embodiment, the organic EL apparatus 200 is completed by performing dicing and fragmenting along the scribe lines SL.

Here, as shown in FIGS. 8A to 8C of the first embodiment, it is also possible to manufacture the organic EL apparatus 200 by respectively arranging the sealing substrates 41, on which the protective member 60 is formed, on the mother substrate 11W.

Second Configuration: Protective Member 60 is Configured of Any of Silicon Oxide Film, Silicon Nitride Film, Silicon Oxynitride Film, or Aluminum Oxide Film With regard to the protective member 60, it is possible to use any of a silicon oxide film ($SiO_2$), a silicon nitride film ($Si_XN_Y$), a silicon oxynitride film ($SiO_XN_Y$) (below, silicon oxide film and the like), or an aluminum oxide film ($Al_2O_3$). The silicon oxide film and the like are used as the sealing films (34a and 34c) described above from the point of the gas barrier properties or light transmitting properties. For this reason, it is also possible to form the protective member 60 on the sealing substrate 41 using the process for manufacturing the sealing films (34a and 34c).

In a case of using an aluminum oxide film as the protective member 60, it is possible to protect the sealing substrate 41 even more compared to a case of using the silicon oxide film and the like. This is because the gas which is used in a sealing film etching process is mainly fluorine-based as described above; however, a mainly chlorine (Cl) based gas is used when etching an aluminum oxide film. In other words, in the sealing film etching process, it is possible to reliably protect the sealing substrate 41 since the aluminum oxide film as the protective member 60 is not easily etched compared to the sealing films (34a and 34c). Examples of a method for forming an aluminum oxide film on the sealing substrate 41 include a vacuum vapor deposition method, a sputtering method, a CVD method, an ion plating method, and the like which are known in the art.

Here, after finishing the sealing film etching process, even when the silicon oxide film and the like and the aluminum oxide film remain on the sealing substrate 41 after completing the role as the mask, it is not a problem in the present configuration. This is because the silicon oxide film and the like and the aluminum oxide film are able to sufficiently secure the light transmitting properties with respect to the emitted light of the organic EL element 30 and sufficiently secure the light emitting characteristics as the organic EL apparatus 200. Thus, since it is not necessary to remove the silicon oxide film and the like and the aluminum oxide film from the sealing substrate 41, a dedicated process for removing the protective member 60 thereof is not necessary.

Here, it is more desirable to form the protective member 60 and the sealing films (34a and 34c) using the same material as a main component. For example, by forming both with a material which has any one of the silicon oxide film and the like as a main component, the protective member 60 is also vaporized in the same manner as the sealing films (34a and 34c) in a process which etches the sealing films (34a and 34c). Thus, since a reaction product of the protective member 60 does not remain, the residue does not influence the mounting terminals 101.

Third Configuration: Main Component of Sealing Films (34a and 34c) is Silicon Nitride Film and Protective Member 60 is Silicon Oxide Film By appropriately selecting the etching gas, it is possible for the etching rate to have the relationship of the following formula (2) under the same conditions.

$$\text{Silicon Nitride Film}(Si_XN_Y) > \text{Silicon Oxide Film}(SiO) \quad (2)$$

Thus, for example, even when forming the sealing films (34a and 34c) and the protective member 60 with the same film thickness, at the time of removing the sealing films (34a and 34c) which are formed of a silicon nitride film by etching, it is possible to leave the protective member 60, which is formed of a silicon oxide film, on the sealing substrate 41. In other words, it is possible to sufficiently protect the sealing substrate 41. Thus, since a residue due to etching of the sealing substrate 41 is not generated, the mounting terminals 101 are not contaminated and it is possible to provide the organic EL apparatus 200 with high connection reliability.

Fourth Configuration: Material of Protective Member 60 is Material whose Refractive Index is Close to that of Sealing Substrate 41

As described above, it is not necessary to remove the silicon oxide film and the like from the sealing substrate 41; however, in a case where the protective member 60 is etched unevenly in the sealing film etching process, there is a possibility that the etching unevenness will be visible due to the difference between the refractive index of the sealing substrate 41 and the refractive index of the protective member 60.

Accordingly, in order to suppress the visibility of the etching unevenness, the refractive index of the sealing substrate 41 and the refractive index of the protective member 60 may be set to be close.

For example, in a case where the sealing substrate 41 is blue sheet glass or non-alkali glass, a silicon oxide film whose refractive index is close is favorable as the protective member 60.

Fifth Configuration: Thickness of Protective Member 60 is Thicker than Thickness of Sealing Films (34a and 34c)

The thickness of the protective member 60 which is formed on the sealing substrate 41 may be made to be thicker than the sealing films (34a and 34c) which cover the terminal section 11t.

Here, the thickness of the sealing films (34a and 34c) is the thickness of a total of the thickness of the first sealing film 34a and the thickness of the second sealing film 34c which are formed on the mounting terminals 101. The thickness of the protective member 60 is the thickness of the protective member 60 which is formed on the sealing substrate 41. Here, it is possible to adopt various types of measuring methods such as cross-sectional observation using a transmission electron microscope, absorption characteristics measurement using infrared spectroscopy, depth analysis using X ray analysis or X ray photoelectron spectroscopy, and the like for measuring each thickness. It is more preferable that the measuring method of the sealing films (34a and 34c) and the measuring method of the protective member 60 are the same and the results are each averaged after performing a multi-point analysis.

According to the configuration, for example, even in a case of using materials with the same etching rate for the sealing films (34a and 34c) and the protective member 60, the protective member 60 still remains on the sealing substrate 41 at the time of removing the sealing films (34a and 34c) by etching. In other words, it is possible to reliably protect the surface of the sealing substrate 41. Thus, it is possible to provide the organic EL apparatus 200 with high connection reliability.

As described above, according to the second embodiment described above, the following effects are further obtained in addition to the effects of the first embodiment described above.

Effects According to First Configuration (1) It is possible to protect the sealing substrate 41 by forming the photosensitive resin which is the protective member 60 on the sealing substrate 41. Thus, the sealing substrate 41 is not etched in the sealing film etching process. For this reason, since a residue due to etching is not generated from the sealing substrate 41, the mounting terminals 101 are not contaminated in the sealing film etching process and it is possible to manufacture and provide the organic EL apparatus 200 with high connection reliability.

(2) Since the sealing substrate 41 may be transparent with respect to light emitted from the organic EL element 30, the selection range of materials for the sealing substrate 41 is widened. Thus, it is possible to provide the organic EL apparatus 200 with high productivity and high connection reliability.

(3) Since the etching rate of the photosensitive resin (the protective member 60) is lower than an etching rate of the sealing films (34a and 34c), it is possible to reduce the etching residue from the photosensitive resin (the protective member 60). Thus, the mounting terminals 101 are not contaminated by the etching residue of the photosensitive resin (the protective member 60) and it is possible to provide the organic EL apparatus 200 with high connection reliability.

Effects According to Second Configuration (1) By setting the protective member 60 as the silicon oxide film and the like, it is possible to divert a process for manufacturing the sealing films (34a and 34c) to forming the protective member 60. In addition, it is possible to reliably protect the sealing substrate 41 from a sealing film etching process. Thus, it is possible to provide the organic EL apparatus 200 with high productivity and high connection reliability.

(2) By setting the protective member 60 as an aluminum oxide, it is possible to protect the protective member 60 from etching in the sealing film etching process. At the same time, it is possible to reliably protect the sealing substrate 41 from the sealing film etching process. Thus, it is possible to provide the organic EL apparatus 200 with high connection reliability.

(3) By setting the protective member 60 as the silicon oxide film and the like, the aluminum oxide, or the like, it is not necessary to remove the protective member 60 from the sealing substrate 41 after the sealing film etching process. In other words, a dedicated process for removing the protective member 60 is not necessary and it is possible to provide the organic EL apparatus 200 with high productivity.

(4) By setting both the sealing films (34a and 34c) and the protective member 60 as silicon oxide and the like, the protective member 60 is also vaporized in the same manner as the sealing films (34a and 34c) in the sealing film etching process and, since a reaction product of the protective member 60 does not remain, the residue does not influence the mounting terminals 101.

Effects According to Third Configuration

By setting the main component of the sealing films (34a and 34c) as a silicon nitride film and setting the protective member 60 as a silicon oxide film, it is possible to make the etching rate of the silicon nitride film greater than the etching rate of the silicon oxide film by appropriately selecting the etching gas. Accordingly, at the time of removing the sealing films (34a and 34c) by etching, the protective member 60 still remains on the sealing substrate 41. In other words, it is possible to sufficiently protect the sealing substrate 41. Thus, since a residue due to etching of the sealing substrate 41 is not generated, the mounting terminals 101 are not contaminated and it is possible to provide the organic EL apparatus 200 with high connection reliability.

Effects according to Fourth Configuration

By setting the refractive index of the sealing substrate 41 and the refractive index of the protective member 60 to be close to each other, even in a case where etching unevenness is generated in the protective member 60 in the sealing film etching process, it is possible to prevent etching unevenness from being visible due to the difference between the refractive index of the sealing substrate 41 and the refractive index of the protective member 60.

Effects According to Fifth Configuration

The thickness of the protective member 60 which is formed on the sealing substrate 41 may be made to be thicker than the sealing films (34a and 34c) which cover the terminal section 11t. In this case, for example, even in a case of using materials which have the same etching rate in the sealing films (34a and 34c) and the protective member 60, the protective member 60 still remains on the sealing substrate 41 at the time of removing the sealing films (34a and 34c) by etching. In other words, it is possible to reliably protect the surface of the sealing substrate 41. Thus, it is possible to provide the organic EL apparatus 200 with high connection reliability.

Method for Estimating Use of Manufacturing Method in Embodiments

By "fluorine being on a surface of the mounting terminals 101", it is possible to reliably estimate that the sealing films (the first sealing film 34a and the second sealing film 34c) on the mounting terminals 101 are etched.

In addition, by "the surface of the sealing substrate 41 (also including the protective member 60) being rough", it is possible to reliably estimate the etching in a state where the sealing substrate 41 is present.

Furthermore, by "not many impurities being on the surface of the mounting terminals 101", it is possible to reliably estimate the application of a manufacturing method where an etching product which is derived from the sealing substrate 41 is not attached.

In addition to the methods described above, by "a material of the sealing substrate 41 being quartz", it is possible to estimate that the manufacturing method of the first embodiment is used. In addition, by "the protective member 60 being on the surface of the sealing substrate 41", it is possible to estimate the use of the manufacturing method of the second embodiment.

In detail, as a comparative example, since a "surface of the sealing substrate 41" in a case where the sealing substrate 41 is non-alkali glass as described above is exposed to the etching gas, the surface becomes rough. "Fluorine on a surface of the mounting terminals 101 or a surface of the sealing substrate 41" is attached due to the etching gas. In addition, since cleaning is difficult, the fluorine remains. For "impurities (Al, Ca, or the like, other than fluorine) on the surface of the mounting terminals 101", products due to etching are not easily volatilized and are attached as a result of impurities which are contained in the sealing substrate 41.

On the other hand, since "the surface of the sealing substrate 41" of the first embodiment is exposed to the etching gas which is used for etching the sealing films (the first sealing film 34a and the second sealing film 34c), the surface becomes rough. "Fluorine on a surface of the mounting terminals 101 or a surface of the sealing substrate 41" is attached due to the etching gas. In addition, since cleaning is difficult, the fluorine remains. For "impurities (Al, Ca, or the like, other than fluorine) on a surface of the mounting terminals 101", since products due to etching are volatilized, there is no attachment.

In addition, "the surface of the sealing substrate 41" of the second embodiment (protective member 60: a material which does not remain in the photosensitive resin and the like) does not become rough. "Fluorine on a surface of the mounting terminals 101 or a surface of the sealing substrate 41" is attached due to the etching gas. In addition, since cleaning is difficult, the fluorine remains. For "impurities (Al, Ca, or the like, other than fluorine) on a surface of the mounting terminals 101", since the products due to etching are volatilized, there is no attachment.

In addition, since "the surface of the protective member 60" of the second embodiment (the protective member 60: a material which remains) is exposed to an etching gas which is used for etching the sealing film (the first sealing film 34a and the second sealing film 34c), the surface becomes rough. "Fluorine on a surface of the mounting terminals 101" is attached due to the etching gas. In addition, since cleaning is difficult, the fluorine remains. For "impurities (Al, Ca, or the like, other than fluorine) on a surface of the mounting terminals 101", since the products due to etching are volatilized, there is no attachment.

In addition, "the surface of the sealing substrate 41" does not become rough in a case of etching the sealing films (the first sealing film 34a and the second sealing film 34c) without using the sealing substrate 41 as a mask (a case of using a physical mask or the like). Since there is no sealing substrate 41, the possibility of the "fluorine on the surface of the mounting terminals 101" being removed during cleaning is high. There is no attachment of "impurities (Al, Ca, or the like, other than fluorine) on the surface of the mounting terminals 101".

In addition, "a surface of the sealing substrate 41" does not become rough in a case where the sealing films (the first sealing film 34a and the second sealing film 34c) are not etched (a case of forming the sealing films by patterning and a case where a surface of the mounting terminals 101 is exposed to an etching gas during patterning of the partition wall 28). There is no "fluorine on the surface of the mounting terminals 101" since there is no etching. Furthermore, there is no attachment of "impurities (Al, Ca, or the like, other than fluorine) on the surface of the mounting terminals 101".

Here, the surface roughness (Ra) of the sealing substrate 41 after being etched is 1 nm or more, for example, approximately 5 nm. "Fluorine on the surface of the mounting terminals 101" is, for example, 5 at % or more in a case of being attached due to the etching gas. "Impurities (Al, Ca, or the like, other than fluorine) on the surface of the mounting terminals 101" are, for example, 1 at % or more.

Third Embodiment

Electronic Device

Figure 12:
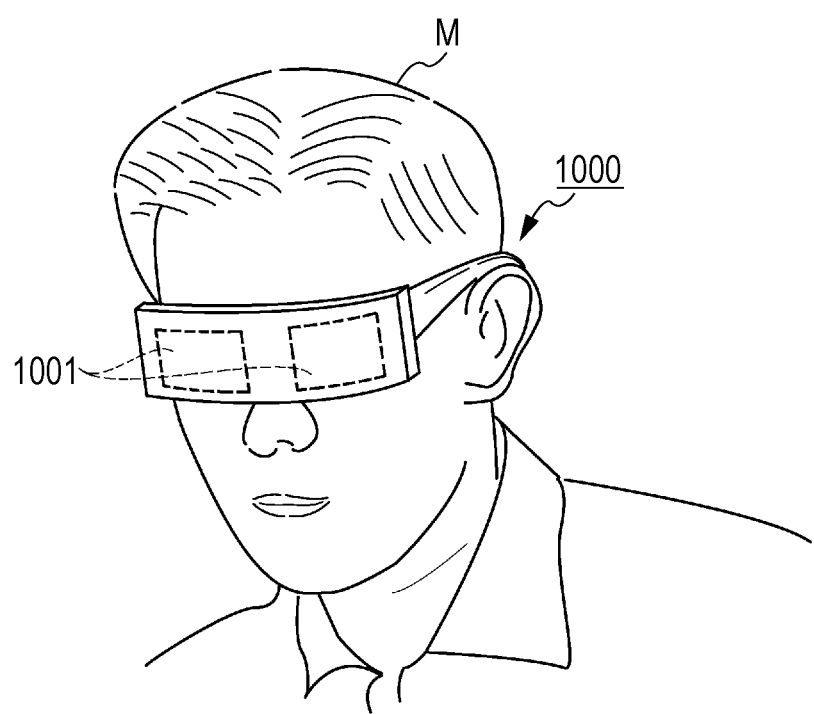
FIG. 12 is a schematic diagram which shows a head mounted display as one example of an electronic device.

Next, description will be given of an electronic device of the present embodiment with reference to FIG. 12. FIG. 12 is a schematic diagram which shows a head mounted display as an electronic device.

As shown in FIG. 12, a head mounted display (HMD) 1000 as an electronic device of the present embodiment has two display sections 1001 which are provided corresponding to left and right eyes. An observer M is able to view characters, images, and the like which are displayed on the display sections 1001 by wearing the head mounted display 1000 on the head as glasses. For example, when images taking parallax into consideration are displayed on the left and right display sections 1001, it is also possible to enjoy viewing a three-dimensional movie.

The organic EL apparatus 100 of the first embodiment described above (alternatively, the organic EL apparatus 200 of the second embodiment described above) is mounted on the display sections 1001. Accordingly, since the organic EL apparatus 100 has excellent display quality and high productivity, it is possible to provide the head mounted display 1000 which is excellent in cost performance, small, and light.

The head mounted display 1000 is not limited to having two display sections 1001 and may have a configuration which is provided with one display section 1001 which corresponds to either left or right.

Here, an electronic device where the organic EL apparatus 100 described above or the organic EL apparatus 200 described above is mounted is not limited to the head mounted display 1000. Examples thereof include an electronic device which has a display section such as a personal computer, a portable information terminal, a navigator, a viewer, and a head up display.

Here, aspects of the invention are not limited to the embodiments described above, are able to appropriately changed within a range which does not depart from gist or ideas of the invention which are able to be read from the claims and the entire specification, and are included in the technical range of aspects of the invention. In addition, it is possible to realize the invention in the following forms.

Modified Examples

In the first and the second embodiments described above, description was given of the organic EL apparatuses 100 and 200 which use the color filter 36 for expressing colors of red (R), green (G), and blue (B); however, the invention is not limited thereto. For example, it is possible to apply the invention to an organic EL apparatus which respectively has an RGB coloring method in which the organic EL element 30 which emits light of three primary colors (R, G, and B) is used, a color conversion method in which emitted light of red (R) and green (G) is obtained through a color conversion layer of a fluorescent body from blue (B) emitted light, and other various types of methods for expressing color.

The entire disclosure of Japanese Patent Application No.: 2014-079186, filed Apr. 8, 2014 and 2015-001353, filed Jan. 7, 2015 are expressly incorporated by reference herein.

What is claimed is:

1. A method for manufacturing an organic EL apparatus, the method comprising:
    forming an organic EL element and a mounting terminal above a first substrate;
    forming a sealing film so as to cover at least the organic EL element and the mounting terminal;
    adhering a second substrate with respect to the first substrate using a filler;
    forming a protective member on the second substrate;
    etching the sealing film using an etching gas so as to expose at least a part of the mounting terminal, wherein the protective member is different than the second substrate, covers at least a part of the second substrate, is used as a mask, and is a composition that reacts with the etching gas and vaporizes such that a reaction product of the protective member does not remain or influence the mounting terminal,
    the protective member is one of a photosensitive resin, a silicon oxide film, a silicon nitride film, a silicon oxynitride film, and an aluminum oxide film,
    the second substrate is a plate glass, and
    the second substrate is made of one of quartz glass, silicate glass, soda glass, and non-alkali glass, the non-alkali glass being a glass which includes components other than silicon oxide (SiO).

2. The method for manufacturing an organic EL apparatus according to claim 1, wherein the sealing film has a silicon oxynitride film as a main component, and the second substrate is the quartz glass.

3. The method for manufacturing an organic EL apparatus according to claim 1, wherein the protective member is the photosensitive resin.

4. The method for manufacturing an organic EL apparatus according to claim 1, wherein the sealing film and the protective member have a same material as a main component.

5. The method for manufacturing an organic EL apparatus according to claim 1, wherein the protective member includes one of the silicon oxide film, the silicon nitride film, the silicon oxynitride film, and the aluminum oxide film.

6. The method for manufacturing an organic EL apparatus according to claim 1, wherein an etching rate of the sealing film is greater than an etching rate of the protective member.

7. The method for manufacturing an organic EL apparatus according to claim 6, wherein the sealing film has a silicon nitride film as a main component and the protective member is the silicon oxide film.

8. The method for manufacturing an organic EL apparatus according to claim 1, wherein
    the second substrate has silicon oxide (SiO) as a main component, and
    the protective member is the silicon oxide film.

9. The method for manufacturing an organic EL apparatus according to claim 1, wherein a thickness of the protective member is greater than a thickness of the sealing film at a portion which covers the mounting terminal.

10. The method for manufacturing an organic EL apparatus according to claim 1, further comprising during etching of the sealing film using the etching gas, constantly exhausting the etching gas while continuously bringing in new etching gas.

11. An electronic device comprising: an organic EL apparatus formed using the method for manufacturing the organic EL apparatus according to claim 1.

12. An electronic device comprising: an organic EL apparatus formed using the method for manufacturing the organic EL apparatus according to claim 2.

* * * * *